(12) United States Patent
Girard et al.

(10) Patent No.: US 9,633,838 B2
(45) Date of Patent: Apr. 25, 2017

(54) VAPOR DEPOSITION OF SILICON-CONTAINING FILMS USING PENTA-SUBSTITUTED DISILANES

(71) Applicant: L'Air Liquide, Société Anonyme pour l'Etude et l'Exploitation des Procédés Georges Claude, Paris (FR)

(72) Inventors: Jean-Marc Girard, Versailles (FR); Changhee Ko, Tsukuba (JP); Ivan Oshchepkov, Tsukuba (JP); Kazutaka Yanagita, Tsukuba (JP); Shingo Okubo, Tsukuba (JP); Naoto Noda, Tsukuba (JP); Julien Gatineau, Seoul (KR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 14/979,816

(22) Filed: Dec. 28, 2015

(65) Prior Publication Data

US 2016/0111272 A1    Apr. 21, 2016

(51) Int. Cl.
| | | |
|---|---|---|
| *H01L 21/02* | (2006.01) | |
| *C23C 16/455* | (2006.01) | |
| *C23C 16/40* | (2006.01) | |
| *C23C 16/34* | (2006.01) | |
| *C23C 16/24* | (2006.01) | |

(52) U.S. Cl.
CPC .......... *H01L 21/0228* (2013.01); *C23C 16/24* (2013.01); *C23C 16/345* (2013.01); *C23C 16/402* (2013.01); *C23C 16/45553* (2013.01); *H01L 21/0217* (2013.01); *H01L 21/0262* (2013.01); *H01L 21/02164* (2013.01); *H01L 21/02236* (2013.01); *H01L 21/02247* (2013.01); *H01L 21/02529* (2013.01); *H01L 21/02532* (2013.01)

(58) Field of Classification Search
CPC .......... H01L 21/0228; H01L 21/02532; H01L 21/0217; H01L 21/02211; H01L 21/02164; H01L 21/02236; H01L 21/02247; C23C 16/45553; C23C 16/345; C23C 16/402; C23C 16/24; C07F 7/025
See application file for complete search history.

(56) References Cited

U.S. PATENT DOCUMENTS

| | | |
|---|---|---|
| 7,077,904 B2 | 7/2006 | Cho et al. |
| 7,540,920 B2 | 6/2009 | Singh et al. |
| 7,758,697 B2 | 7/2010 | Comita et al. |

(Continued)

FOREIGN PATENT DOCUMENTS

| | | |
|---|---|---|
| JP | 2014194723 | 10/2014 |
| WO | WO 2012039833 | 3/2012 |

OTHER PUBLICATIONS

Burton, B.B., et al, Rapid SiO2 Layer Deposition Using Tris(tert-pentoxy)silanol, Chem. Mater., 2008, 7031-7043.

(Continued)

*Primary Examiner* — Michael Trinh
(74) *Attorney, Agent, or Firm* — Patricia E. McQueeney

(57) ABSTRACT

Disclosed are methods of depositing silicon-containing films on one or more substrates via vapor deposition processes using penta-substituted disilanes, such as pentahalodisilane or pentakis(dimethylamino)disilane.

5 Claims, 14 Drawing Sheets

(56) References Cited

U.S. PATENT DOCUMENTS

| | | | |
|---|---|---|---|
| 2004/0224089 A1* | 11/2004 | Singh | C01B 33/04 427/255.27 |
| 2008/0026149 A1* | 1/2008 | Tomasini | C23C 16/04 427/255.28 |
| 2012/0108079 A1* | 5/2012 | Mahajani | C23C 16/308 438/788 |
| 2015/0004317 A1* | 1/2015 | Dussarrat | B05D 1/60 427/255.6 |
| 2015/0099374 A1* | 4/2015 | Kakimoto | C23C 16/45534 438/791 |

OTHER PUBLICATIONS

Chen, S-W., et al., A Study of Trimethylsilane (3MS) and Tetramethylsilane (4MS) Based α-SiCN:H/α-SiCO:H Diffusion Barrier Films, Materials, 2012, 5, 377-384.

Du, Y., et al., Mechanism of Pyridine-Catalyzed SiO2 Atomic Layer Deposition Studied by Fourier Transform Infrared Spectroscopy, J. Phys. Chem. C, 2007, 111, 219-226.

Ferguson, J.D., et al., Atomic layer deposition of Al2O3 and SiO2 on BN particles using sequential surface reactions, Applied Surface Science, 162-163, 2002, 280-292.

George, S.M., Atomic Layer Deposition: An Overview, Chem. Rev., 2010, 111-131.

Li, S-Y., et al., Selectivity Control in Plasma Etching for Dual Damascene with OSG films, The 199$^{th}$ Meeting of the Electrochemical Society, Mar. 25-30, 2001, Washington, D.C. USA.

Morishita, S., et al., Atomic-layer chemical-vapor-deposition of silicon-nitride, Applied Surface Science, 112, 1997, 198-204.

Park, K., et al., Growth studies and characterization of silicon nitride thin films deposited by alternating exposures to Si2Cl6 and NH3, Thin Solid Films, 517, 2009, 3975-3978.

Swihart, M.T., et al., Thermochemistry and Thermal Decomposition of the Chlorinated Disilanes (Si2H$n$CL6-$n$, $n$=0-6) Studied by ab Initio Molecular Orbital Methods, J. Phys. Chem. A, 1997, 101, 7434-7445.

Tahir, D., et al., Electronic and optical properties of Al2O3/SiO2 thin films grown on Si Substrate, J. Phys. D: Appl. Phys., 43, 2010, 25301 (7pp).

Xu, P., et al., A Breakthrough in Low-$k$ Barrier/Etch Stop Films for Copper Damascene Applications, Semiconductor Fabtech, 11$^{th}$ Ed., 239-244.

Yeh, W-C., et al., Low-Temperature Chemical-Vapor-Deposition of Silicon-Nitride Film from Hexachloro-Disilane and Hydrazine, Jpn. J. Appl. Phys, 35, 1996, 1509-1512.

Klaus, J.W., et al., Atomic layer deposition of SiO2 at room temperature using NH3-catalyzed sequential surface reactions, Surface Science, 447, 2000, 81-90.

Miikkulainen et al., Crystallinity of Inorganic Films Grown by Atomic Layer Deposition—Overview and General Trends, Applied Physics Reviews, in press 2012, 14.9.2012, 1-92.

\* cited by examiner

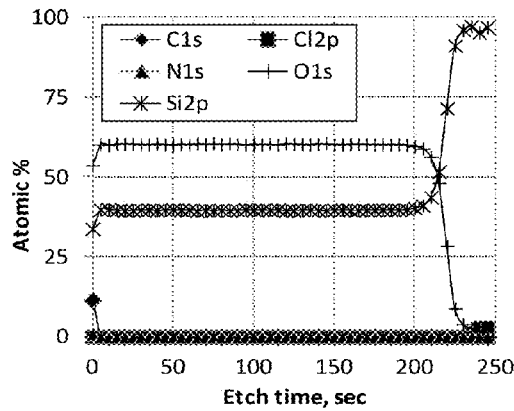
FIG 4a - 400°C
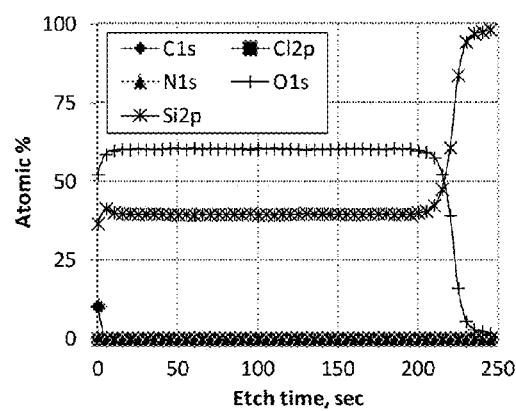
FIG 4b - 500°C
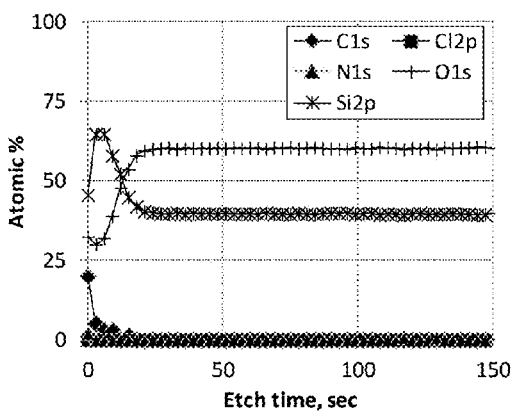
FIG 4c - 600°C
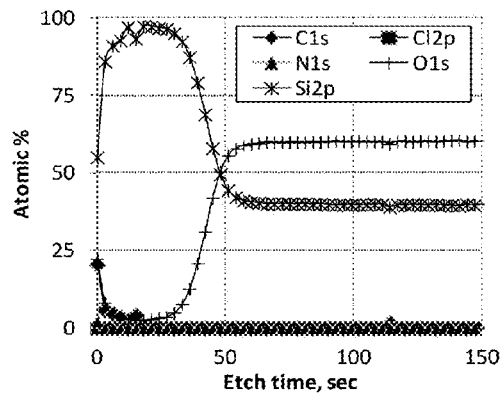
FIG 4d - 700°C

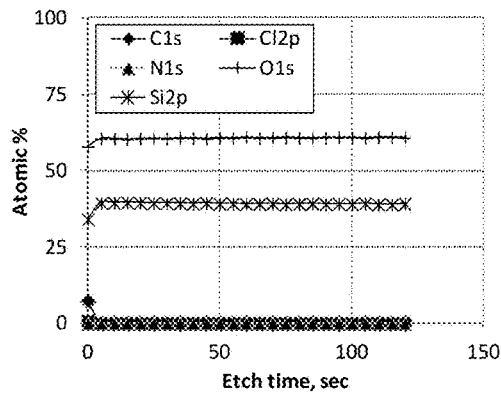
FIG 5a - 400°C
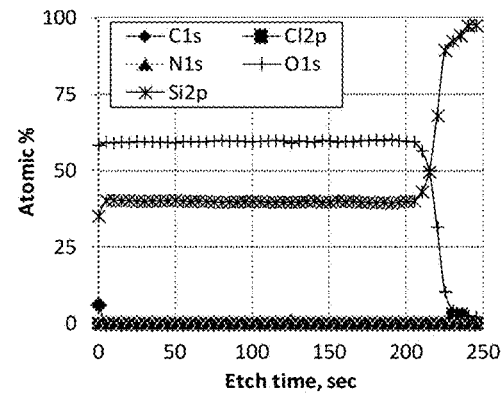
FIG 5b - 500°C
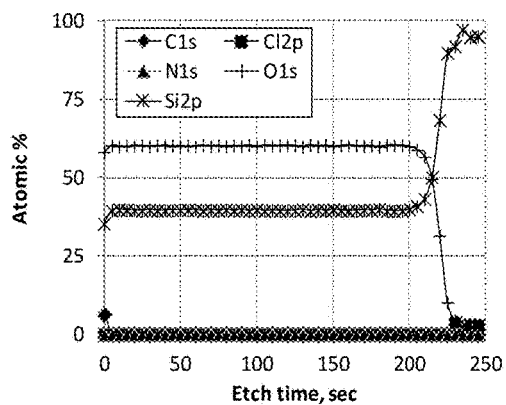
FIG 5c - 600°C
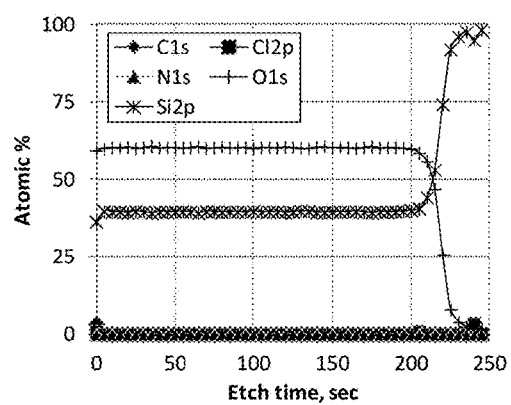
FIG 5d - 700°C

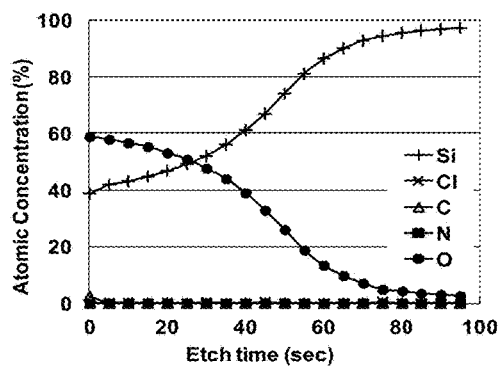
FIG 8a - 500°C
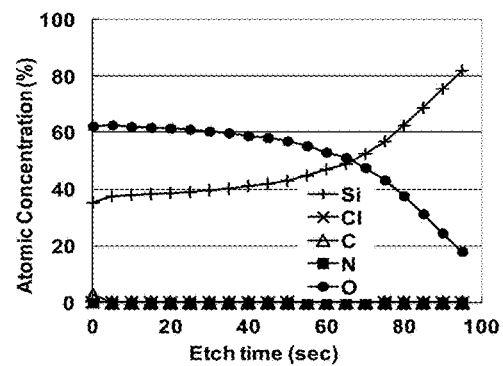
FIG 8b - 600°C
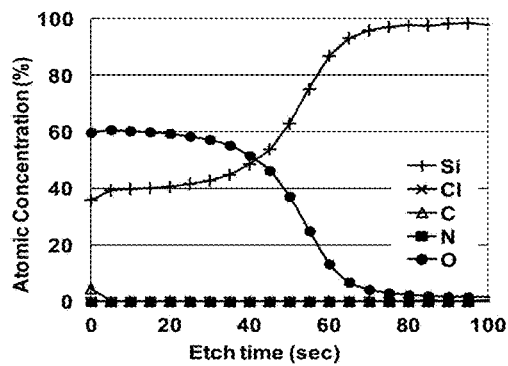
FIG 8c - 650°C
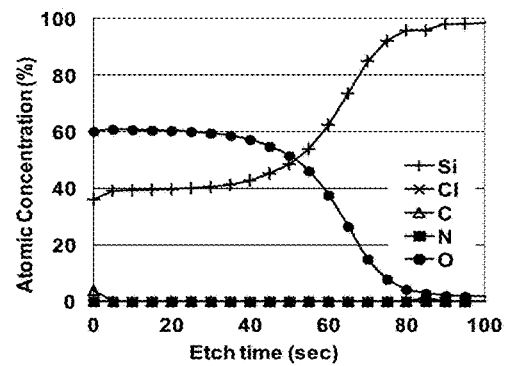
FIG 8d - 700°C

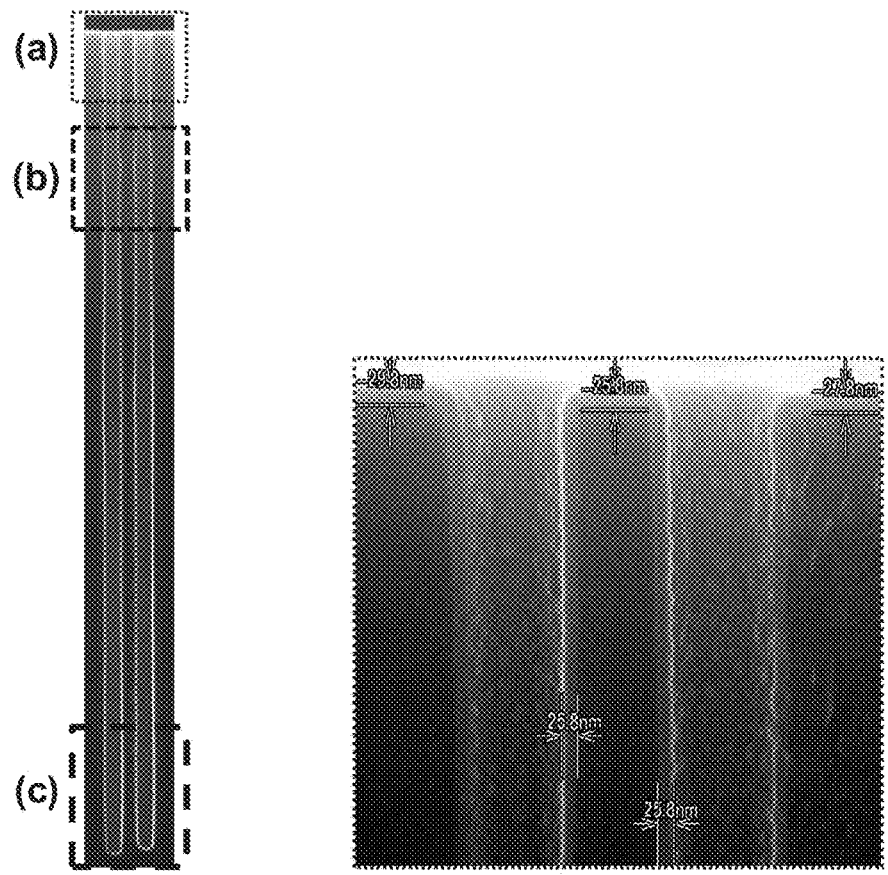
FIG 9　　　　　　　　　　　FIG 9(a)
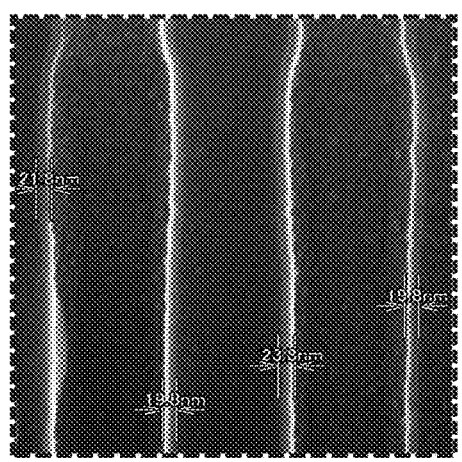　　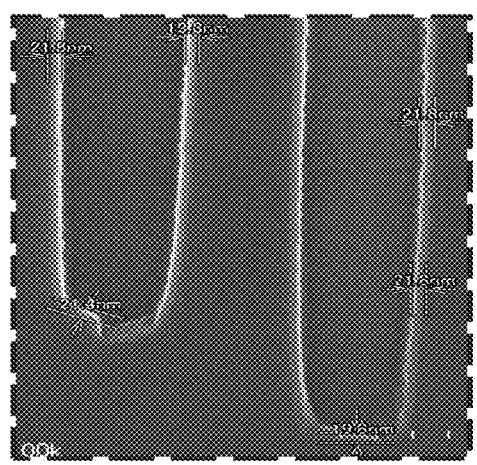
FIG 9(b)　　　　　　　　　　FIG 9(c)

_US 9,633,838 B2_

VAPOR DEPOSITION OF SILICON-CONTAINING FILMS USING PENTA-SUBSTITUTED DISILANES

TECHNICAL FIELD

Disclosed are methods of depositing silicon-containing films on one or more substrates via vapor deposition processes using penta-substituted disilanes, such as pentachlorodisilane or pentakis(dimethylamino)disilane.

BACKGROUND

Silicon-containing films are one of the most important components in semiconductor devices and development of their various fabrication processes has been highly investigated. Silicon oxide ($SiO_2$) films may be used as capacitor and insulating layers. D. Tahir et al., "Electronic and optical properties of $Al_2O_3/SiO_2$ films grown on Si substrate", J. Phys. D: Appl. Phys. 43, 255301 (2010). Silicon nitride (SiN), silicon carbide (SiC) and silicon carbonitride (SiCN) films may be used as hard mask, diffusion barriers or trench etch-stop layers. Si-Yi Li et al., "Selectivity Control in Plasma Etching for Dual Damascene with OSG films", Abstract #242, 199th ECS Meeting (2001); Ping Xu et al., "A Breakthrough in Low-k Barrier/Etch Stop Films for Copper Damascene Applications", Semiconductor FABTECH, 11, 239 (2000); Y. L. Wang et al., "Integration of SiCN as a Low k Etch Stop and Cu Passivation in a High Performance Cu/Low k Interconnect", Materials 5, 377-384 (2012).

Use of pentachlorodisilane (PCDS or $Si_2HCl_5$) and pentakis(dimethylamino)disilane ($Si_2H(NMe_2)_5$) as vapor deposition precursors has been described in the prior art. See, e.g., US2004/224089 to Singh et al., WO2007/112780 to Dussarrat, and US2008/026149 to Tomasini et al.

However, it remains a challenge to find silicon-containing precursors suitable for commercial deposition of silicon-containing films.

SUMMARY

Disclosed are vapor deposition processes for the deposition of silicon-containing films on substrates. The vapor of a Si-containing film forming precursor is introduced into a reactor containing the substrate. The Si-containing film forming composition comprises a penta-substituted disilane precursor. At least part of the penta-substituted disilane film forming precursors is deposited onto the substrate to form the silicon-containing film. The disclosed processes may further include one or more of the following aspects:

The penta-substituted disilane precursor being pentachlorodisilane (PCDS or $Si_2HCl_5$);
The penta-substituted disilane precursor being pentaiododisilane ($Si_2HI_5$);
The penta-substituted disilane precursor being pentabromodisilane ($Si_2HBr_5$);
The penta-substituted disilane precursor being pentafluorodisilane ($Si_2HF_5$);
The penta-substituted disilane precursor being pentakis(dimethylamino)disilane [$Si_2H(NMe_2)_5$];
the Si-containing film forming composition comprising between approximately 99% w/w and approximately 100% w/w of the penta-substituted disilane precursor;
the Si-containing film forming composition comprising between approximately 95% w/w and approximately 100% w/w of the penta-substituted disilane precursor;
the Si-containing film forming composition comprising between approximately 0% w/w and approximately 5% w/w impurities;
the Si-containing film forming composition comprising between approximately 0.0% w/w and approximately 2.0% w/w impurities;
the Si-containing film forming composition comprising between approximately 0.0% w/w and approximately 1.0% w/w impurities;
the impurities including hexa-, tetra-, and tris-substituted disilanes having the formula $Si_2H_xX_y$, wherein X=Cl, Br, I, or $NR_2$, R=H or a C1-C4 alkyl group, x=0, 2, or 3, and x+y=6; tetra-substituted silanes having the formula $SiX_4$, wherein X=Cl, Br, I, or $NR_2$, and R=H or a C1-C4 alkyl group; tris-substituted silanes having the formula $SiHX_3$, wherein X=Cl, Br, I, or $NR_2$, and R=H or a C1-C4 alkyl group; partially substituted trisilanes having the formula $Si_3H_xX_y$, wherein X=Cl, Br, I, or $NR_2$, R=H or a C1-C4 alkyl group, x+y=8 and x=1 to 6; siloxanes having the formula $SiHX_2$—O—$SiX_3$, wherein X=Cl, Br, I, or $NR_2$, and R=H or a C1-C4 alkyl group; siloxanes having the formula $H_xX_ySi$—O—$SiH_xX_y$, wherein X=Cl, Br, I, or $NR_2$, R=H or a C1-C4 alkyl group, x=0, 2, or 3, and x+y=3; siloxanes having the formula $SiH_xX_y$—O—$SiH_xX_y$, wherein X=Cl, Br, I, or $NR_2$, R=H or a C1-C4 alkyl group hydrogen, x+y=3, and x=0 or 1; siloxanes having the formula $H_xX_ySi$—O—$(Si_2H_aX_b)$, wherein X=Cl, Br, I, or $NR_2$, R=H or a C1-C4 alkyl group, x+y=3, a+b=6, x=1 to 3, and a=0, 2, or 3; siloxanes having the formula $H_xX_ySi$—O—$SiH_aX_b$—O—$SiH_xX_y$, wherein X=Cl, Br, I, or $NR_2$, R=H or a C1-C4 alkyl group, x+y=3, a+b=2, x=1 to 3, and a=0 to 2; iodine; bromine; chlorine; dialkylamines, such as dimethylamine or ethylamine; THF; ether; pentane; hexane; cyclohexane; heptanes; benzene; toluene; or combinations thereof;
the Si-containing film forming composition comprising between approximately 0.0% w/w and approximately 1.0% w/w hexa-substituted disilanes having the formula $Si_2X_6$, wherein X=Cl, Br, I, or $NR_2$, R=H or a C1-C4 alkyl group;
the Si-containing film forming composition comprising between approximately 0.0% w/w and approximately 1.0% w/w tetra-substituted disilanes having the formula $Si_2H_2X_4$, wherein X=Cl, Br, I, or $NR_2$, R=H or a C1-C4 alkyl group;
the Si-containing film forming composition comprising between approximately 0.0% w/w and approximately 1.0% w/w tris-substituted disilanes having the formula $Si_2H_3X_3$, wherein X=Cl, Br, I, or $NR_2$, R=H or a C1-C4 alkyl group;
the Si-containing film forming composition comprising between approximately 0.0% w/w and approximately 1.0% w/w tetra-substituted silanes having the formula $SiX_4$, wherein X=Cl, Br, I, or $NR_2$, and R=H or a C1-C4 alkyl group;
the Si-containing film forming composition comprising between approximately 0.0% w/w and approximately 1.0% w/w tris-substituted silanes having the formula $SiHX_3$, wherein X=Cl, Br, I, or $NR_2$, and R=H or a C1-C4 alkyl group;
the Si-containing film forming composition comprising between approximately 0.0% w/w and approximately 1.0% w/w partially substituted trisilanes having the formula $Si_3H_xX_y$, wherein X=Cl, Br, I, or $NR_2$, R=H or a C1-C4 alkyl group, x+y=8, and x=1 to 6;

the Si-containing film forming composition comprising between approximately 0.0% w/w and approximately 1.0% w/w siloxanes having the formula $SiHX_2$—O—$SiX_3$, wherein X=Cl, Br, I, or $NR_2$, and R=H or a C1-C4 alkyl group;

the Si-containing film forming composition comprising between approximately 0.0% w/w and approximately 1.0% w/w siloxanes having the formula $H_xX_ySi$—O—$SiH_xX_y$, wherein X=Cl, Br, I, or $NR_2$, R=H or a C1-C4 alkyl group, x=0, 2, or 3, and x+y=3;

the Si-containing film forming composition comprising between approximately 0.0% w/w and approximately 1.0% w/w siloxanes having the formula $SiH_xX_y$—O—$SiH_xX_y$, wherein X=Cl, Br, I, or $NR_2$, R=H or a C1-C4 alkyl group hydrogen, x+y=3, and x=0 or 1;

the Si-containing film forming composition comprising between approximately 0.0% w/w and approximately 1.0% w/w siloxanes having the formula $H_xX_ySi$—O—$(Si_2H_aX_b)$, wherein X=Cl, Br, I, or $NR_2$, R=H or a C1-C4 alkyl group, x+y=3, a+b=5, x=1 to 3, and a=0, 2, or 3;

the Si-containing film forming composition comprising between approximately 0.0% w/w and approximately 1.0% w/w siloxanes having the formula $H_xX_ySi$—O—$SiH_aX_b$—O—$SiH_xX_y$, wherein X=Cl, Br, I, or $NR_2$, R=H or a C1-C4 alkyl group, x+y=3, a+b=2, x=1 to 3, and a=0 to 2;

the Si-containing film forming composition comprising between approximately 0.0% w/w and approximately 1.0% w/w dialkylamines, such as dimethylamine or ethylamine;

the Si-containing film forming composition comprising between approximately 0.0% w/w and approximately 1.0% w/w THF;

the Si-containing film forming composition comprising between approximately 0.0% w/w and approximately 1.0% w/w ether;

the Si-containing film forming composition comprising between approximately 0.0% w/w and approximately 1.0% w/w pentane;

the Si-containing film forming composition comprising between approximately 0.0% w/w and approximately 1.0% w/w hexane;

the Si-containing film forming composition comprising between approximately 0.0% w/w and approximately 1.0% w/w cyclohexane;

the Si-containing film forming composition comprising between approximately 0.0% w/w and approximately 1.0% w/w heptanes;

the Si-containing film forming composition comprising between approximately 0.0% w/w and approximately 1.0% w/w benzene;

the Si-containing film forming composition comprising between approximately 0.0% w/w and approximately 1.0% w/w toluene;

the Si-containing film forming composition comprising between approximately 0 ppbw and approximately 1 ppmw metal impurities;

the Si-containing film forming composition comprising between approximately 0 ppbw and approximately 500 ppbw metal impurities;

The vapor deposition process being an atomic layer deposition (ALD) process;

The vapor deposition process being a chemical vapor deposition (CVD) process;

Further comprising introducing an oxidant into the reactor;

The oxidant being $O_2$, $O_3$, $H_2O$, $H_2O_2$, NO, $N_2O$, $NO_2$, carboxylic acids, formic acid, acetic acid, propionic acid, oxygen containing radicals thereof, or mixtures thereof;

The oxidant being $O_2$, $O_3$, $H_2O$, oxygen containing radicals thereof, or mixtures thereof;

The oxidant being $O_2$, $O_3$, oxygen containing radicals thereof, or mixtures thereof;

The oxidant being a 7.2% v/v mixture of $O_3$ in $O_2$;

The silicon-containing film being silicon oxide;

The silicon oxide film having a wet etch rate less than or equal to ten times the wet etch rate of silicon oxide deposited by thermal deposition using a dilute HF solution (0.5 to 1% HF);

The silicon oxide film being deposited at a temperature ranging from approximately 450° C. to approximately 800° C.;

The ALD process depositing a silicon oxide film at a temperature ranging from approximately 550° C. to approximately 600° C.;

The thermal ALD process depositing a silicon oxide film at a temperature ranging from approximately 100° C. to approximately 400° C.;

The plasma ALD process depositing a silicon oxide film at a temperature ranging from approximately room temperature to approximately 400° C.;

The silicon oxide film containing between approximately 0 atomic % and approximately 5 atomic % carbon;

The silicon oxide film containing between approximately 0 atomic % and approximately 2.5 atomic % carbon;

The silicon oxide film containing between approximately 0 atomic % and approximately 1 atomic % carbon;

The silicon oxide film containing between approximately 0 atomic % and approximately 1 atomic % nitrogen;

The silicon oxide film containing between approximately 0 atomic % and approximately 1 atomic % chlorine;

Silicon oxide film exhibiting step coverage between approximately 70% and approximately 100% for an aspect ratio of 1:7;

Silicon oxide film exhibiting step coverage between approximately 70% and approximately 100% for an aspect ratio of 1:20;

Silicon oxide film exhibiting step coverage between approximately 90% and approximately 100% for an aspect ratio of 1:7;

Silicon oxide film exhibiting step coverage between approximately 90% and approximately 100% for an aspect ratio of 1:20;

Further comprising introducing a nitrogen-containing reactant into the reactor;

The nitrogen-containing reactant being $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, nitrogen-containing radical species thereof, and mixtures thereof;

The nitrogen-containing reactant being $NH_3$;

The silicon-containing film being silicon nitride;

The silicon nitride film being deposited at a temperature ranging from approximately 450° C. to approximately 650° C.;

The silicon nitride film having a refractivity index that ranges from approximately 1.7 to approximately 2.2;

Further comprising introducing an amine, an alkylaminosilane, or a disilazane into the reactor;

The amine being ammonia;

The alkylaminosilane being bis(diethylamino)silane;

The alkylaminosilane being tris(dimethylamino)silane;

The disilazane being hexamethyldisilazane;
The silicon containing film being a carbon doped silicon nitride film;
The carbon doped silicon nitride film having a carbon concentration ranging from approximately 5 atomic % to approximately 40 atomic %;
The carbon doped silicon nitride film having a nitrogen concentration ranging from approximately 20 atomic % to approximately 60 atomic %;
The carbon doped silicon nitride film having an oxygen concentration ranging from approximately 0 atomic % to approximately 5 atomic %;
The process being a plasma enhanced atomic layer deposition (PEALD) process;
Further comprising introducing a nitrogen-containing reactant into the reactor;
The nitrogen-containing reactant being $N_2$, $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, a mixture of $N_2$ and $H_2$, nitrogen-containing radical species thereof, and mixtures thereof;
The nitrogen-containing reactant being $NH_3$, $N_2$, a mixture of $N_2$ and $H_2$, and mixtures thereof;
The mixture of $N_2$ and $H_2$ containing between approximately 0% v/v to approximately 70% v/v $H_2$;
The mixture of $N_2$ and $H_2$ containing approximately 50% v/v $H_2$;
The silicon containing film being a carbon doped silicon nitride film;
The PEALD process depositing a carbon doped silicon nitride film at a temperature ranging from approximately 100° C. to approximately 350° C.;
The carbon doped silicon nitride film having a refractive index ranging from approximately 1.6 to approximately 2.1; and
The carbon doped silicon nitride film having a carbon concentration ranging from approximately 1 atomic % to approximately 15 atomic %.

Also disclosed are processes for the vapor deposition of silicon carbide films on one or more substrates. The vapor of a silicon-containing film forming composition comprising is introduced into a reactor containing the substrate(s). The silicon-containing film forming compositions comprises a silicon halide. At least part of the silicon halide is deposited onto the substrate(s) to form the silicon carbide film. An alkyl substituted metal or metalloid is introduced into the reactor. At least part of the alkyl substituted metal or metalloid is deposited onto the substrate to form the silicon carbide film. The disclosed processes may further include one or more of the following aspects:

the Si-containing film forming composition comprising between approximately 99% w/w and approximately 100% w/w of the silicon halide;
the Si-containing film forming composition comprising between approximately 95% w/w and approximately 100% w/w of the silicon halide;
the Si-containing film forming composition comprising between approximately 0% w/w and approximately 5% w/w impurities;
the Si-containing film forming composition comprising between approximately 0.0% w/w and approximately 2.0% w/w impurities;
the Si-containing film forming composition comprising between approximately 0.0% w/w and approximately 1.0% w/w impurities;
the impurities including hexa-substituted disilanes; alkylamines; dialkylamines; alkylimines; iodosilanes; aminosilanes; lithium, sodium, or potassium iodide; iodine; THF; ether; pentane; cyclohexane; heptanes; benzene; toluene; halogenated metal compounds;
the Si-containing film forming composition comprising between approximately 0 ppbw and approximately 1 ppmw metal impurities;
the Si-containing film forming composition comprising between approximately 0 ppbw and approximately 500 ppbw metal impurities;
The silicon halide containing at least one halogen atom;
The silicon halide containing at least one silicon-halogen bond;
The silicon halide having the formula $SiX_4$, each X independently being Cl, Br, I, H, or R and R being an aliphatic group;
The silicon halide being $SiCl_3H$;
The silicon halide being $SiH_2Cl_2$;
The silicon halide being $SiH_3Cl$;
The silicon halide being $SiI_2H_2$;
The silicon halide being $SiHMeI_2$;
The silicon halide being $SiMe_2I_2$;
The silicon halide being $SiH_xCl_{3-x}(CH_2Cl)$, with x=0-3;
The silicon halide being $SiH_3(CH_2Cl)$;
The silicon halide being $SiH_2Cl(CH_2Cl)$;
The silicon halide being $SiHCl_2(CH_2Cl)$;
The silicon halide being $SiCl_3(CH_2Cl)$;
The silicon halide having the formula $Si_2X_6$, with each X independently being Cl, Br, I, or H;
The silicon halide being pentachlorodisilane;
The silicon halide being pentabromodisilane;
The silicon halide being pentaiododisilane;
The silicon halide being pentafluorodisilane;
The silicon halide being hexachlorodisilane;
The silicon halide being hexaiododisilane;
The silicon halide being monochlorodisilane;
The silicon halide being monobromodisilane;
The silicon halide being monoiododisilane;
The silicon halide being 1,1-dichlorodisilane [$Cl_2HSi$—$SiH_3$];
The silicon halide being dibromodisilane [$H_2BrSi$—$SiBrH_2$];
The silicon halide being diiododisilane [$H_2ISi$—$SiIH_2$];
The silicon halide being dichlorodisilane [$H_3Si$—$SiHCl_2$];
The silicon halide being dibromodisilane [$H_3Si$—$SiHBr_2$];
The silicon halide being diiododisilane [$H_3Si$—$SiHI_2$];
The silicon halide having the formula $X_3Si$—$CH_2$—$SiX_3$, with each X independently being Cl, Br, I, or H;
The silicon halide being bis(dichlorosilyl)methane [$(SiClH_2)_2CH_2$];
The silicon halide being monochlorotrisilapentane [$H_3Si$—$CH_2$—$SiH_2Cl$];
The silicon halide having the formula $X_3Si$—$CH_2$—$CH_2$—$SiX_3$, with each X independently being Cl, Br, I, or H;
The silicon halide having the formula $X_3Si$—$CH_2$—$SiX_2$—$CH_2$—$SiX_3$, with each X independently being Cl or H, provided at least one terminal X is Cl;
The silicon halide having the formula $Cl_3Si$—$CH_2$—$SiCl_2$—$CH_2$—$SiCl_3$;
The silicon halide having the formula $H_3Si$—$CH_2$—$SiH_2$—$CH_2$—$SiClH_2$;
The silicon halide having the formula ($-SiX_2$—$CH_2-$)$_3$, with each X independently being Cl, Br, or I;

The silicon halide having the formula (—SiHX—CH$_2$—)$_3$, with each X independently being Cl, Br, or I;
The silicon halide being octachlorotrisilane (OCTS);
The silicon halide being decachlorotetrasilane (Si$_4$Cl$_{10}$);
The silicon halide being dodecachloropentasilane (DCPS or Si$_5$Cl$_{12}$);
The alkyl substituted metal or metalloid having the formula AlR$_3$, with each R independently being H, Me, Et, nPr, iPr, nBu, iBu, or NR$_2$, provided that when R$_3$=H$_3$ that the molecule may be adducted with an amine or borohydride;
The alkyl substituted metal or metalloid being triethyl aluminum;
The alkyl substituted metal or metalloid being trimethyl aluminum;
The alkyl substituted metal or metalloid being AlH$_3$.NH$_3$;
The alkyl substituted metal or metalloid having the formula BR$_3$, with each R independently being an alkyl or an allyl group;
The alkyl substituted metal or metalloid being triethyl boron;
The alkyl substituted metal or metalloid being trimethyl boron;
The alkyl substituted metal or metalloid having the formula AlClR$_2$, with each R independently being H, Me, Et, nPr, iPr, nBu, or iBu, or NR$_2$;
The alkyl substituted metal or metalloid having the formula BXR$_2$, with X being Cl, Br, or I and each R independently being an alkyl or an allyl group;
The alkyl substituted metal or metalloid having the formula ZnR$_2$, with each R independently being Me, Et, nPr, iPr, nBu, or iBu;
The alkyl substituted metal or metalloid having the formula GaR$_3$, with each R independently being Me, Et, nPr, iPr, nBu, iBu, or NR$_2$;
The alkyl substituted metal or metalloid being trimethyl gallium; and
The alkyl substituted metal or metalloid having the formula InR$_3$, with each R independently being Me, Et, nPr, iPr, nBu, iBu, or NR$_2$.

Also disclosed is a Si-containing film forming composition delivery device comprising a canister having an inlet conduit and an outlet conduit and containing any of the Si-containing film forming compositions disclosed above. The disclosed device may include one or more of the following aspects:

the Si-containing film forming composition having a total concentration of metal contaminants of less than 10 ppmw;
an end of the inlet conduit end located above a surface of the Si-containing film forming composition and an end of the outlet conduit located below the surface of the Si-containing film forming composition;
an end of the inlet conduit end located below a surface of the Si-containing film forming composition and an end of the outlet conduit located above the surface of the Si-containing film forming composition;
further comprising a diaphragm valve on the inlet and the outlet;
further comprising one or more barrier layers on an interior surface of the canister;
further comprising one to four barrier layers on an interior surface of the canister;
further comprising one or two barrier layers on an interior surface of the canister;
each barrier layer comprising a silicon oxide layer, a silicon nitride layer, silicon oxynitride layer, a silicon carbonitride, silicon oxycarbonitride layer, or combinations thereof;
wherein each barrier layer is 5 to 1000 nm in thickness;
wherein each barrier layer is 50 to 500 nm in thickness;
the Si-containing film forming composition comprising pentachlorodisilane (PCDS or Si$_2$HCl$_5$);
the Si-containing film forming composition comprising pentaiododisilane (Si$_2$HI$_5$);
the Si-containing film forming composition comprising pentabromodisilane (Si$_2$HBr$_5$);
the Si-containing film forming composition comprising pentafluorodisilane (Si$_2$HF$_5$);
the Si-containing film forming composition comprising pentakis(dimethylamino)disilane [Si$_2$H(NMe$_2$)$_5$];
The Si-containing film forming composition comprising SiCl$_3$H;
The Si-containing film forming composition comprising SiH$_2$Cl$_2$;
The Si-containing film forming composition comprising SiH$_3$Cl;
The Si-containing film forming composition comprising SiI$_2$H$_2$;
The Si-containing film forming composition comprising SiHMeI$_2$;
The Si-containing film forming composition comprising SiMe$_2$I$_2$;
The Si-containing film forming composition comprising SiH$_x$Cl$_{3-x}$(CH$_2$Cl), with x=0-3;
The Si-containing film forming composition comprising SiH$_3$(CH$_2$Cl);
The Si-containing film forming composition comprising SiH$_2$Cl(CH$_2$Cl);
The Si-containing film forming composition comprising SiHCl$_2$(CH$_2$Cl);
The Si-containing film forming composition comprising SiCl$_3$(CH$_2$Cl);
The Si-containing film forming composition comprising a silicon halide having the formula Si$_2$X$_6$, with each X independently being Cl, Br, I, or H;
The Si-containing film forming composition comprising pentachlorodisilane;
The Si-containing film forming composition comprising pentabromodisilane;
The Si-containing film forming composition comprising pentaiododisilane;
The Si-containing film forming composition comprising pentafluorodisilane;
The Si-containing film forming composition comprising hexachlorodisilane;
The Si-containing film forming composition comprising hexaiododisilane;
The Si-containing film forming composition comprising monochlorodisilane;
The Si-containing film forming composition comprising monobromodisilane;
The Si-containing film forming composition comprising monoiododisilane;
The Si-containing film forming composition comprising 1,1-dichlorodisilane [Cl$_2$HSi—SiH$_3$];
The Si-containing film forming composition comprising dibromodisilane [H$_2$BrSi—SiBrH$_2$];
The Si-containing film forming composition comprising diiododisilane [H$_2$ISi—SiIH$_2$];
The Si-containing film forming composition comprising dichlorodisilane [H$_3$Si—SiHCl$_2$];

The Si-containing film forming composition comprising dibromodisilane [H$_3$Si—SiHBr$_2$];

The Si-containing film forming composition comprising diiododisilane [H$_3$Si—SiHI$_2$];

The Si-containing film forming composition comprising a silicon halide having the formula X$_3$Si—CH$_2$—SiX$_3$, with each X independently being Cl, Br, I, or H;

The Si-containing film forming composition comprising bis(dichlorosilyl)methane [(SiClH$_2$)$_2$CH$_2$];

The Si-containing film forming composition comprising monochlorotrisilapentane [H$_3$Si—CH$_2$—SiH$_2$Cl];

The Si-containing film forming composition comprising a halide having the formula X$_3$Si—CH$_2$—CH$_2$—SiX$_3$, with each X independently being Cl, Br, I, or H;

The Si-containing film forming composition comprising a silicon halide having the formula X$_3$Si—CH$_2$—SiX$_2$—CH$_2$—SiX$_3$, with each X independently being Cl or H, provided at least one terminal X is Cl;

The Si-containing film forming composition comprising a silicon halide having the formula Cl$_3$Si—CH$_2$—SiCl$_2$—CH$_2$—SiCl$_3$;

The Si-containing film forming composition comprising a silicon halide having the formula H$_3$Si—CH$_2$—SiH$_2$—CH$_2$—SiClH$_2$;

The Si-containing film forming composition comprising a silicon halide having the formula (—SiX$_2$—CH$_2$—)$_3$, with each X independently being Cl, Br, or I;

The Si-containing film forming composition comprising a silicon halide having the formula (—SiHX—CH$_2$—)$_3$, with each X independently being Cl, Br, or I;

The Si-containing film forming composition comprising octachlorotrisilane (OCTS);

The Si-containing film forming composition comprising decachlorotetrasilane (Si$_4$Cl$_{10}$); and The Si-containing film forming composition comprising dodecachloropentasilane (DCPS or Si$_5$Cl$_{12}$).

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula MR$^1_x$ (NR$^2$R$^3$)$_{(4-x)}$, where x is 2 or 3, the two or three R$^1$ groups may, but need not be identical to each other or to R$^2$ or to R$^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "Pr," refers to a propyl group; the abbreviation, "iPr," refers to an isopropyl group; the abbreviation "Bu" refers to butyl; the abbreviation "tBu" refers to tert-butyl; and the abbreviation "sBu" refers to sec-butyl.

Please note that the films or layers deposited, such as silicon oxide or silicon nitride, may be listed throughout the specification and claims without reference to their proper stoichiometry (i.e., SiO$_2$, SiO$_3$, Si$_3$N$_4$). The layers may include pure (Si) layers, carbide (Si$_o$C$_p$) layers, nitride (Si$_k$N$_l$) layers, oxide (Si$_n$O$_m$) layers, or mixtures thereof, wherein k, l, m, n, o, and p inclusively range from 1 to 6. For instance, silicon oxide is Si$_n$O$_m$, wherein n ranges from 0.5 to 1.5 and m ranges from 1.5 to 3.5. More preferably, the silicon oxide layer is SiO$_2$ or SiO$_3$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

Any and all ranges recited herein are inclusive of their endpoints (i.e., x=1 to 4 includes x=1, x=4, and x=any number in between).

The standard abbreviations of the elements from the periodic table of elements are used herein. It should be understood that elements may be referred to by these abbreviations (e.g., Mn refers to manganese, Si refers to silicon, C refers to carbon, etc.).

BRIEF DESCRIPTION OF THE FIGURES

For a further understanding of the nature and objects of the present invention, reference should be made to the following detailed description, taken in conjunction with the accompanying figures wherein:

FIG. 4(a) is a X-ray Photoelectron Spectroscopy (XPS) depth profile of the Si film resulting from thermal decomposition of PCDS at approximately 400° C.;

FIG. 4(b) is a XPS depth profile of the Si film resulting from thermal decomposition of PCDS at approximately 500° C.;

FIG. 4(c) is a XPS depth profile of the Si film resulting from thermal decomposition of PCDS at approximately 600° C.;

FIG. 4(d) is a XPS depth profile of the Si film resulting from thermal decomposition of PCDS at approximately 700° C.;

FIG. 5(a) is a XPS depth profile of the Si film resulting from thermal decomposition of HCDS at approximately 400° C.;

FIG. 5(b) is a XPS depth profile of the Si film resulting from thermal decomposition of HCDS at approximately 500° C.;

FIG. 5(c) is a XPS depth profile of the Si film resulting from thermal decomposition of HCDS at approximately 600° C.;

FIG. 5(d) is a XPS depth profile of the Si film resulting from thermal decomposition of HCDS at approximately 700° C.;

FIG. 8(a) is a XPS depth profile of the $SiO_2$ film resulting from ALD deposition using PCDS and ozone on a Si substrate at approximately 500° C.;

FIG. 8(b) is a XPS depth profile of the $SiO_2$ film resulting from ALD deposition using PCDS and ozone on a Si substrate at approximately 600° C.;

FIG. 8(c) is a XPS depth profile of the $SiO_2$ film resulting from ALD deposition using PCDS and ozone on a Si substrate at approximately 650° C.;

FIG. 8(d) is a XPS depth profile of the $SiO_2$ film resulting from ALD deposition using PCDS and ozone on a Si substrate at approximately 700° C.;

FIG. 9 is a scanning electronic microscope (SEM) picture showing step coverage of an $SiO_2$ film deposited on a deep hole pattern wafer having an aspect ratio of 40:1 by 350 ALD cycles using PCDS and ozone at approximately 600° C.;

FIG. 9(a) is an enlarged SEM picture showing the $SiO_2$ step coverage at the top of the structure of FIG. 9;

FIG. 9(b) is an enlarged SEM picture showing the $SiO_2$ step coverage at the middle of the structure of FIG. 9;

FIG. 9(c) is an enlarged SEM picture showing the $SiO_2$ step coverage at the bottom of the structure of FIG. 9;

DESCRIPTION OF PREFERRED EMBODIMENTS

Figure 1:
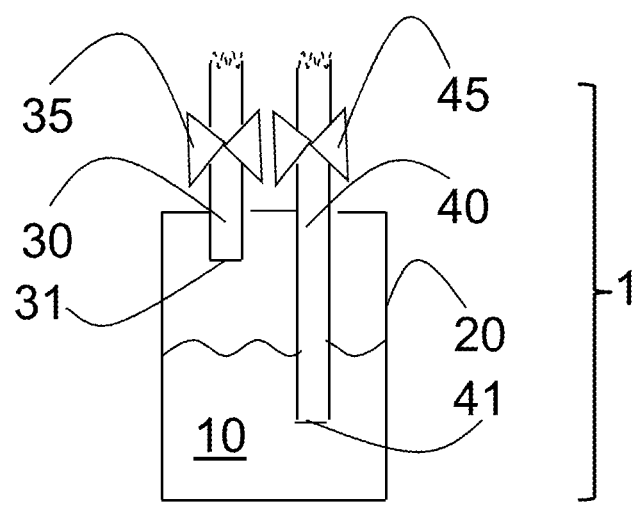
FIG. 1 is a side view of one embodiment of the Si-containing film forming composition delivery device disclosed herein.

Processes for the deposition of silicon-containing films on one or more substrates are disclosed. The vapor of a silicon-containing film forming composition is introduced into a reactor having a substrate disposed therein. The silicon-containing film forming compositions comprises a penta-substituted disilane precursor. At least part of the penta-substituted disilane precursor is deposited onto the substrate to form the silicon-containing film.

The penta-substituted disilane precursor may be pentachlorodisilane (PCDS or $Si_2HCl_5$), pentafluorodisilane ($Si_2HF_5$), pentabromodisilane ($Si_2HBr_5$), or pentaiododisilane ($Si_2HI_5$).

Pentachlorodisilane is not currently commercially available. However, methods of producing pentachlorodisilane are known in the art. One preferred method is disclosed in JP Pat App No 2014-194723 filed Sep. 25, 2014, the contents of which are incorporated by reference herein in its entirety. More particularly, PCDS may be isolated by distillation from the chlorosilane by-products produced in the synthesis of trichlorosilane. The corresponding pentahalodisilanes may be synthesized in the same manner. The pentahalodisilane may be purified by continuous or fractional batch distillation to a purity ranging from approximately 95% w/w to approximately 100% w/w, preferably ranging from approximately 99% w/w to approximately 100% w/w. One of ordinary skill in the art will recognize that the distillation column will require a large number of theoretical plates in order to purify the pentahalodisilane from its halodisilane analogs.

The concentration of hexahalodisilane in the purified pentahalodisilane may range from approximately 0% w/w to approximately 5% w/w, preferably from approximately 0% w/w to approximately 1% w/w. The concentration of $O_2$ in the purified pentahalodisilane may range from approximately 0 ppmw to approximately 50 ppmw, preferably from approximately 0 ppmw to approximately 4 ppmw, and more preferably from approximately 0 ppmw to approximately 1 ppmw. The purified pentahalodisilane should contain no water, 0 ppmw, or the two will react. The concentration of Cr in the purified pentahalodisilane may range from approximately 0 ppmw to approximately 25 ppmw. The concentration of Fe in the purified pentahalodisilane may range from approximately 0 ppmw to approximately 100 ppmw. The concentration of Na in the purified pentahalodisilane may range from approximately 0 ppmw to approximately 50 ppmw. The concentration of Ni in the purified pentahalodisilane may range from approximately 0 ppmw and approximately 25 ppmw.

Alternatively, the penta-substituted disilane precursor may be pentakis(dimethylamino)disilane [PDMADS-$Si_2H$($NMe_2)_5$]. PDMADS is also not currently commercially available. However, methods of synthesizing it are disclosed, for example, in WO2007/112780 to Dussarrat, the contents of which are incorporated by reference herein in its entirety. More particularly, pentakis(dimethyamino)chlorodisilane is produced by reacting hexachlorodisilane with more than 5 fold moles of dimethylamine (Me$_2$NH) in an organic solvent at a temperature from −30° C. to 50° C. PDMADS is formed by reduction of the pentakis(dimethylamino)chlorodisilane using lithium aluminum hydride or sodium boron hydride.

PDMADS may be purified by continuous or fractional batch distillation to a purity ranging from approximately 95% w/w to approximately 100% w/w, preferably ranging from approximately 99% w/w to approximately 100% w/w. One of ordinary skill in the art will recognize that the distillation column will require a large number of theoretical plates in order to purify PDMADS from its aminodisilane analogs.

The concentration of hexa(dimethylamino)disilane in the purified PDMADS may range from approximately 0% w/w to approximately 5% w/w, preferably from approximately 0% w/w to approximately 1% w/w. The concentration of O$_2$ in the purified PDMADS may range from approximately 0 ppmw to approximately 50 ppmw, preferably from approximately 0 ppmw to approximately 4 ppmw, and more preferably from approximately 0 ppmw to approximately 1 ppmw. No water (0 ppmw) can be contained within PDMADS or the two will react. The concentration of Cr in the purified PDMADS may range from approximately 0 ppmw to approximately 25 ppmw. The concentration of Fe in the purified PDMADS may range from approximately 0 ppmw to approximately 100 ppmw. The concentration of Na in the purified PDMADS may range from approximately 0 ppmw to approximately 50 ppmw. The concentration of Ni in the purified PDMADS may range from approximately 0 ppmw and approximately 25 ppmw.

As illustrated in the following Examples, Applicants have surprisingly found that using penta-substituted disilane film forming precursors for the process of silicon-containing film deposition provides a faster ALD growth rate and a reasonable ALD temperature window at which useable film is deposited with high purity when compared to films deposited by analogous hexasubstituted disilanes, such as HCDS or Si$_2$(NHMe)$_6$. Applicants believe that the substitution of one ligand of a hexasubstituted disilane, wherein all of the ligands are the same, with H produces a more reactive molecule (i.e., Si$_2$Cl$_6$→Si$_2$HCl$_5$ or Si$_2$(NMe$_2$)$_6$→Si$_2$H(NMe$_2$)$_5$). The increased reactivity of the penta-substituted disilane film forming precursors may be due to the smaller atomic size of the hydrogen ligand compared to the larger atomic size of the chlorine or dimethylamino ligands in case of HCDS and Si$_2$(NMe$_2$)$_6$, respectively. The smaller sized hydrogen ligand may provide less steric hindrance and therefore a higher possibility of physi- or chemi-sorption onto the substrate or onto the previously formed layer, resulting in faster growth behavior. The hydrogen ligand may also make the penta-substituted disilane film forming precursors more acidic than HCDS and Si$_2$(NMe$_2$)$_6$, resulting in higher reactivity. Increased reactivity may also be due to substitution of one ligand of a hexasubstituted disilane with H, slightly polarizing the Si—Si bond due to the change from a symmetrical molecule to an unsymmetrical molecule.

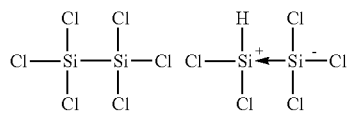

The disclosed processes for forming silicon-containing layers on a substrate using a vapor deposition process may be useful in the manufacture of semiconductor, photovoltaic, LCD-TFT, or flat panel type devices. The disclosed Si-containing film forming compositions may be used to deposit silicon-containing films using any deposition methods known to those of skill in the art. Examples of suitable deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated deposition, super critical fluid deposition, and combinations thereof. Exemplary ALD methods include thermal ALD, plasma enhanced ALD (PEALD), spatial isolation ALD, hot-wire ALD (HWALD), and combinations thereof. The deposition method is preferably ALD, PE-ALD, or spatial isolation ALD in order to provide suitable step coverage and film thickness control.

The disclosed Si-containing film forming compositions may comprise only the penta-substituted disilane precursor. Alternatively, the Si-containing film forming composition may further comprise a solvent, such as toluene, xylene, mesitylene, decane, dodecane, or other suitable hydrocarbons. The disclosed precursors may be present in varying concentrations in the solvent.

The disclosed Si-containing film forming compositions are introduced into a reactor in vapor form by conventional means, such as tubing and/or flow meters. The vapor form of the composition may be produced through a conventional vaporization step such as direct vaporization, distillation, or by bubbling. The composition may be fed in liquid state to a vaporizer (direct liquid injection or "DLI") where it is vaporized before it is introduced into the reactor. Alternatively, the composition may be vaporized by passing a carrier gas into a container containing the composition or by bubbling the carrier gas into the composition. The carrier gas may include, but is not limited to, Ar, He, N$_2$, and mixtures thereof. Bubbling with a carrier gas may also remove any dissolved oxygen present in the composition. The carrier gas and composition are then introduced into the reactor as a vapor.

If necessary, the container of disclosed Si-containing film forming composition may be heated to a temperature that permits the composition to have a sufficient vapor pressure. The container may be maintained at temperatures in the range of, for example, approximately 0° C. to approximately 150° C. Those skilled in the art recognize that the temperature of the container may be adjusted in a known manner to control the amount of composition vaporized.

Figure 2:
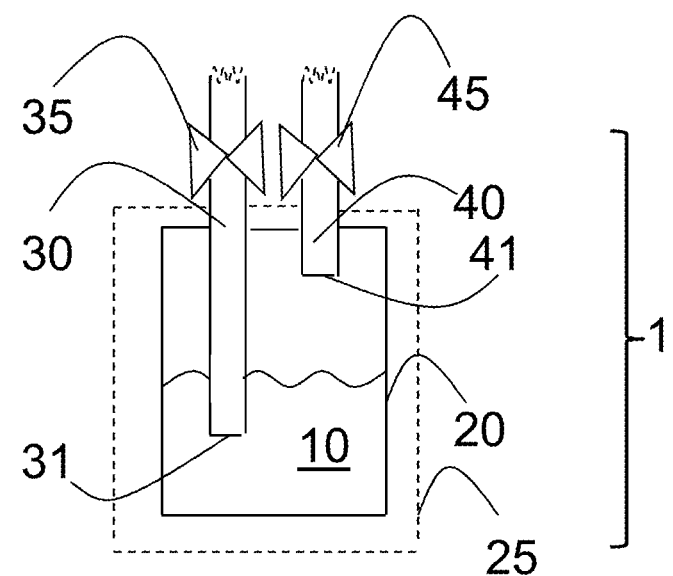
FIG. 2 is a side view of a second embodiment of the Si-containing film forming composition delivery device disclosed herein.

For example, the Si-containing film forming compositions may be introduced into the reactor using the disclosed Si-containing film forming composition delivery devices. FIGS. 1 and 2 show two embodiments of the disclosed delivery devices 1.

FIG. 1 is a side view of one embodiment of the Si-containing film forming composition delivery device 1. In FIG. 1, the disclosed Si-containing film forming compositions 10 are contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Si-containing film forming composition 10, even at elevated temperature and pressure.

The delivery device should be leak tight and be equipped with valves that do not permit release of the material. Suitable valves include spring-loaded or tied diaphragm valves. The valve may further comprise a restrictive flow orifice (RFO). The delivery device may be connected to a gas manifold or in an enclosure. The gas manifold should permit the safe evacuation and purging of the piping that may be exposed to air when the delivery device is replaced so that any residual amounts of the material do not react. The enclosure may be equipped with sensors and fire control capability to control the fire in the case of material release. The gas manifold should also be equipped with isolation valves, vacuum generators, and permit the introduction of a purge gas at a minimum.

The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel. However, one of ordinary skill in the art will recognize that other non-reactive materials may also be used in the teachings herein and that any corrosive Si-containing film forming compositions 10 may require the use of more corrosion-resistant materials, such as Hastelloy or Inconel.

In FIG. 1, the end 31 of inlet conduit 30 is located above the surface of the Si-containing film forming composition 10, whereas the end 41 of the outlet conduit 40 is located below the surface of the Si-containing film forming composition 10. In this embodiment, the Si-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Si-containing film forming composition 10 is forced through the outlet conduit 40 and to components in the semiconductor processing tool (not shown). The semiconductor processing tool may include a vaporizer which transforms the liquid Si-containing film forming composition 10 into a vapor, with or without the use of a carrier gas such as helium, argon, nitrogen or mixtures thereof, in order to deliver the vapor to a chamber where a substrate is located and treatment occurs in the vapor phase. Alternatively, the liquid Si-containing film forming composition 10 may be delivered directly to the substrate surface as a jet or aerosol.

FIG. 2 is a side view of a second embodiment of the Si-containing film forming composition delivery device 1. In FIG. 2, the end 31 of inlet conduit 30 is located below the surface of the Si-containing film forming composition 10, whereas the end 41 of the outlet conduit 40 is located above the surface of the Si-containing film forming composition 10. FIG. 2, also includes an optional heating element 25, which may increase the temperature of the Si-containing film forming composition 10. In this embodiment, the Si-containing film forming composition 10 may be in solid or liquid form. An inert gas, including but not limited to nitrogen, argon, helium, and mixtures thereof, is introduced into the inlet conduit 30. The inert gas bubbles through the Si-containing film forming composition 10 and carries a mixture of the inert gas and vaporized Si-containing film forming composition 10 to the outlet conduit 40 and on to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Si-containing film forming composition 10 is in vapor form or if sufficient vapor pressure is present above the solid/liquid phase. In this case, the Si-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Si-containing film forming composition 10 to be delivered in vapor form, for example by the use of an optional heating element 25.

While FIGS. 1 and 2 disclose two embodiments of the Si-containing film forming composition delivery device 1, one of ordinary skill in the art will recognize that the inlet conduit 30 and outlet conduit 40 may both be located above or below the surface of the Si-containing film forming composition 10 without departing from the disclosure herein. Furthermore, inlet conduit 30 may be a filling port. Finally, one of ordinary skill in the art will recognize that the disclosed Si-containing film forming composition may be delivered to semiconductor processing tools using other delivery devices, such as the ampoules disclosed in WO 2006/059187 to Jurcik et al., without departing from the teachings herein.

The vapor of the disclosed Si-containing film forming compositions is delivered to the reactor of a semiconductor, photovoltaic, LCD-TFT, flat panel type devices, refractory materials, or aeronautics tool. The reactor may be any enclosure or chamber of a device in which vapor deposition methods take place such as without limitation, a parallel-plate type reactor, a cold-wall type reactor, a hot-wall type reactor, a single-wafer reactor, a multi-wafer (i.e., batch) reactor, or other types of deposition systems suitable to cause the precursor to react and form the layers. All of these exemplary reactors are capable of serving as ALD and/or CVD reactors.

Generally, the reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon nitride layers, silicon oxy nitride layers, carbon doped silicon oxide (SiCOH) layers, for combinations thereof. Additionally, the wafers may include copper layers, tungsten layers, or noble metal layers (e.g. platinum, palladium, rhodium, or gold). Plastic layers, such as poly(3,4-ethylenedioxythiophene) poly (styrenesulfonate) [PEDOT:PSS] may also be used. The layers may be planar or patterned. The disclosed processes may deposit the silicon-containing layer directly on the wafer or directly on one or more than one layer (when patterned layers form the substrate) of the layers on top of the wafer. Throughout the specification and claims, the wafer and any associated layers thereon are referred to as substrates. For example, a Cu film may be deposited onto a SiC layer. In subsequent processing, a SiC layer may be deposited on the Cu layer, forming a SiC/Cu/SiC stack used in a damascene structure in the back end of the line (BEOL).

The temperature and the pressure within the reactor are held at conditions suitable for vapor deposition. In other words, after introduction of the vaporized composition into the chamber, conditions within the chamber are such that at least part of the penta-substituted disilane precursor is deposited onto the substrate to form the silicon-containing film. For instance, the pressure in the reactor may be held between about 1 Pa and about $10^5$ Pa, more preferably between about 25 Pa and about $10^3$ Pa, as required per the deposition parameters. Likewise, the temperature in the reactor may be held between about 100° C. and about 800° C. One of ordinary skill in the art will recognize that "at least part of the penta-substituted disilane precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately room temperature (20° C.) to approximately 500° C. When a plasma deposition process is utilized, the deposition temperature may range from approximately room temperature (20° C.) to approximately 400° C. Alternatively, when ozone is used as a reactant, the deposition temperature may range from approximately 100° C. to approximately 400° C. In another alternative, when a thermal process is performed, the deposition temperature may range from approximately 200° C. to approximately 500° C.

In addition to the disclosed Si-containing film forming compositions, a reactant may also be introduced into the reactor. The reactant may be an oxidizing gas such as one of $O_2$, $O_3$, $H_2O$, $H_2O_2$, NO, $N_2O$, $NO_2$, oxygen containing radicals such as O. or OH., NO, $NO_2$, carboxylic acids, formic acid, acetic acid, propionic acid, and mixtures thereof. Typically, the oxidizing gas is selected from the group consisting of $O_2$, $O_3$, $H_2O$, $H_2O_2$, oxygen containing radicals thereof such as O. or OH., and mixtures thereof. More typically, the oxidizing gas is $O_2$, $O_3$, $O_2$ plasma, or combinations thereof.

The reactant may be treated by a plasma, in order to decompose the reactant into its oxygen containing radical form. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Si-containing films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 3 Torr to approximately 10 Torr, the reactant $O_2$ may be decomposed into two O. radicals. Preferably, the remote plasma may be generated with a power ranging from about 1 kW to about 10 kW, more preferably from about 2.5 kW to about 7.5 kW.

The resulting silicon oxide films may be used as capacitors and insulating layers.

Silicon oxides may be deposited using pentakis(dimethylamino)disilane and an oxidizing gas in an ALD or CVD process. The process may be a thermal ALD process at a temperature ranging from approximately 100° C. to approximately 400° C. when using an ozone reactant. Alternatively, the process may be a plasma enhanced ALD process at a temperature ranging from approximately room temperature (approximately 23° C.) to 400° C. ALD depositions of silicon oxide films using the pentakis(dimethylamino)disilane precursor are expected to produce deposition rates on the order of approximately 1 angstrom/cycle. Most alkyl amino monosilanes exhibit a lower deposition rate, typically approximately 0.5 angstroms/cycle.

As illustrated in the examples, silicon oxide films may also be deposited at high temperatures using pentachlorodisilane and an oxidizing gas in an ALD or CVD process. The temperature may range from approximately 450° C. to approximately 800° C., preferably from approximately 450° C. to approximately 600° C., and more preferably from approximately 500° C. to approximately 600° C. High temperature silicon oxide film deposition is important to produce films having high density, low wet etch rates, and low contaminant levels, for example, with metal impurities ranging from $10^9$ to $10^{17}$ atoms/$cm^3$. In fact, as shown in Examples 2-5, ALD depositions using pentachlorodisilane and an ozone/oxygen mixture exhibited self-limited growth at a temperature range of approximately 550° C. to approximately 650° C. The resulting film had little to no nitrogen or chlorine contamination. The resulting silicon oxide film preferably contains between approximately 0 atomic % and approximately 1 atomic % nitrogen. The resulting silicon oxide film also contains between approximately 0 atomic % and approximately 1 atomic ° A) chlorine.

Alternatively, the reactant may be a reducing gas such as one of $H_2$, $H_2CO$, $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzofuran, pyrazoline, trimethylaluminium, dimethylzinc, diethylzinc, radical species thereof, and mixtures thereof. Preferably, the reducing as is $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, or mixtures thereof.

In another alternative, the reactant may be a nitrogen-containing reactant such as one of $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, N($C_2H_5$)$_3$, (SiMe$_3$)$_2$NH, (CH$_3$)HNNH$_2$, (CH$_3$)$_2$NNH$_2$, nitrogen-containing radical species thereof, and mixtures thereof.

As disclosed above with respect to the oxidizing gas reactant, the reducing gas or nitrogen containing reactant may also be treated by a plasma in order to decompose the reactant into its radical form. N$_2$ may also be utilized as a reducing gas when treated with plasma and a blend of N$_2$ and H$_2$ may be used in a remote plasma process. The plasma may be generated in situ or remotely, as detailed described in further detailed above.

For example, as illustrated in Examples 7 and 8, silicon nitride films may be deposited at medium range temperatures using pentachlorodisilane and a N-containing gas in an ALD or CVD process. The temperature may range from approximately 350° C. to approximately 650° C., preferably from approximately 450° C. to approximately 650° C., and more preferably from approximately 550° C. to approximately 600° C. This medium range temperature is important to the silicon nitride deposition process because the underlying substrate may not be able to withstand higher process temperatures without sustaining damage. In fact, as shown in Example 8, ALD depositions using pentachlorodisilane and an ammonia reactant produced silicon nitride films having a refractive index ranging from approximately 1.7 to approximately 2.2. The refractive index of pure silicon nitride is 2.0. The incorporation of oxygen or a porous film will lower the refractive index and an excess of silicon will increase the refractive index. As shown in Example 8 and FIG. 14, the resulting film had little to no carbon and traces of oxygen and chlorine contamination. The silicon nitride film may contain between approximately 0 atomic % and approximately 5 atomic % carbon, preferably between approximately 0 atomic % and approximately 2.5 atomic % carbon; and more preferably between approximately 0 atomic % and approximately 1 atomic % carbon. The silicon nitride film may also contain between approximately 0.1 atomic % and approximately 1 atomic % oxygen. Finally, the silicon nitride film may contain between approximately 0.1 atomic % and approximately 1 atomic % chlorine.

The silicon nitride films produced using the disclosed penta-substituted disilane and nitrogen-containing reactant may be used as a spacer for a fin double patterning process, as a spacer for dual Epi sidewall, as a contact etch stop layer, or as a capping layer for self aligned contacts in FinFET. When used as a spacer for the fin double patterning process, the silicon nitride growth rate does not exhibit pattern loading effect (the growth rate being lower on a dense feature as compared to flat areas of the substrate). When used as a spacer for a dual Epi sidewall or as a contact etch stop layer, the silicon nitride film has a low dielectric constant (between approximately 3 to approximately 6, preferably between approximately 4.5 and approximately 5.5) and a low HF wet etch rate (between 0 Ang/sec and 10 Ang/sec for 1% HF at room temperature).

The silicon nitride films produced using the disclosed penta-substituted disilane and nitrogen-containing reactant may also be used in DRAM manufacturing. More particularly, the silicon nitride layer may serve as a DRAM spacer, a Buried Word Line (BWL) nitride cap, a bit line spacer, or a low-k Etch Stop Layer (ESL) for capacitors.

The silicon nitride layers produced using the disclosed penta-substituted disilane and nitrogen-containing reactant may also be used as a nitride trap layer in 3D NAND manufacturing. The nitride trap layer should have no seam and a low dielectric constant (between approximately 3 to approximately 6, preferably between approximately 4.5 and approximately 5.5).

The silicon nitride layers produced using the disclosed penta-substituted disilane and nitrogen-containing reactant may also be used for encapsulation in MRAM manufacturing. The films needs to be deposited at low temperature (between approximately 200° C. and approximately 500° C., preferably between approximately 275° C. and approximately 350° C.) and should be halide free (containing between approximately 0.1 atomic % and approximately 1 atomic % halide). PEALD is particularly suitable for these applications.

The silicon nitride layers produced using the disclosed penta-substituted disilane and nitrogen-containing reactant may also be used as air gap lines in advanced interconnect manufacturing. The air gap lines need to be deposited at low temperatures (between approximately 200° C. and approximately 500° C., preferably between approximately 275° C. and approximately 350° C.), have a low dielectric constant (between approximately 3 to approximately 6, preferably between approximately 4.5 and approximately 5.5), have a low wet etch rate (between 0 Ang/sec and 10 Ang/sec for 1% HF at room temperature), and be halide free (containing between approximately 0.1 atomic % and approximately 1 atomic % halide).

As shown in Example 10, carbon doped silicon nitrides may also be deposited using the penta-substituted disilanes, such as pentakis(dimethylamino)disilane, and a nitrogen containing reactant in a low temperature plasma enhanced ALD process. Preferably, the nitrogen containing reactant is NH$_3$, N$_2$, or a combination of N$_2$ and H$_2$. The H$_2$ concentration in the combination of N$_2$ and H$_2$ may range from approximately 0% vol/vol to approximately 70% vol/vol. For example, the N$_2$:H$_2$ ratio may be 1:1. The process temperature may range from approximately 100° C. to approximately 350° C. The carbon concentration in the carbon doped silicon nitride film may range from approximately 1 atomic % to approximately 15 atomic %.

In another alternative, the reactant may be an amine, alkylaminosilane, or a disilazane to produce a carbon doped silicon nitride film. Exemplary amines include ammonia. Exemplary alkylaminosilanes include bis(diethylamino)silane or tris(dimethylamino)silane. Exemplary disilazanes include hexamethyldisilazane. The carbon doped silicon nitride film preferably has a carbon concentration ranging from approximately 2 atomic % to approximately 15 atomic %, a nitrogen concentration ranging from approximately 10 atomic % to approximately 50 atomic %, and an oxygen concentration ranging from approximately 0 atomic % to approximately 5 atomic %.

In another alternative, the reactant may be an alkyl substituted metal or metalloid. The alkyl substituted metal or metalloid may have the formula AlR$_3$, with each R independently being H, Me, Et, nPr, iPr, nBu, iBu, or NR2, provided that when R$_3$=H$_3$ that the molecule may be adducted with an amine or borohydride. For example, the alkyl substituted metal or metalloid being triethyl aluminum, trimethyl aluminum, or AlH$_3$.NH$_3$. Alternatively, the alkyl substituted metal or metalloid may have the formula BR$_3$, with each R independently being an alkyl or an allyl group. For example, the alkyl substituted metal or metalloid may be triethyl boron or trimethyl boron. Alternatively, the alkyl substituted metal or metalloid may have the formula AlClR$_2$, with each R independently being H, Me, Et, nPr, iPr, nBu, or iBu, or NR$_2$. In another alternative, the alkyl substituted metal or metalloid may have the formula BXR$_2$, with X being Cl, Br, or I and each R independently being an alkyl or an allyl group. In yet another alternative, the alkyl substituted metal or metalloid having the formula $ZnR_2$, with each R independently being Me, Et, nPr, iPr, nBu, or iBu. In another alternative, the alkyl substituted metal or metalloid having the formula $GaR_3$, with each R independently being Me, Et, nPr, iPr, nBu, iBu, or $NR_2$. For example, the alkyl substituted metal or metalloid being trimethyl gallium. In yet another alternative, the alkyl substituted metal or metalloid having the formula $InR_3$, with each R independently being Me, Et, nPr, iPr, nBu, iBu, or $NR_2$.

As shown in Example 9, the penta-substituted disilane and the alkyl substituted metal or metalloid may be used to deposit silicon carbide films using an ALD process. However, in addition to the disclosed penta-substituted disilanes, Applicants believe that any silicon halide precursors may be useful in this process, provided the precursor contains at least one halide, because the halide reacts with the metal or metalloid forming a volatile halide.

Additional silicon halides that may be suitable for use in the ALD deposition of silicon carbide films include silicon halides having the formula $SiX_n$, each X independently being Cl, Br, I, H, or R, with R being an aliphatic group. Exemplary silicon halides include $SiCl_3H$, $SiH_2Cl_2$, $SiH_3Cl$, $SiI_2H_2$, $SiHMeI_2$, or $SiMe_2I_2$. In another alternative, the silicon halide may have the formula $Si_2X_6$, with each X independently being Cl, Br, I, or H. Exemplary silicon halides include pentachlorodisilane, hexachlorodisilane, hexaiododisilane, monochlorodisilane, monobromodisilane, monoiododisilane, dichlorodisilane [$H_2ClSi-SiClH_2$], dibromodisilane [$H_2BrSi-SiBrH_2$], diiododisilane [$H_2ISi-SiIH_2$], dichlorodisilane [$H_3Si-SiHCl_2$], dibromodisilane [$H_3Si-SiHBr_2$], or diiododisilane [$H_3Si-SiHI_2$]. In another alternative, the silicon halide may have the formula $X_3Si-CH_2-SiX_3$, with each X independently being Cl, Br, I, or H, such as bis(trichlorosilyl)methane [$Cl_3Si-CH_2-SiCl_3$] or bis(dichlorosilyl)methane [$(SiClH_2)_2CH_2$]. In another alternative, the silicon halide may have the formula $X_3Si-CH_2-CH_2-SiX_3$, with each X independently being Cl, Br, I, or H, such as $Cl_3Si-CH_2-CH_2-SiCl_3$. In another alternative, the silicon halide may have the formula $X_3Si-CH_2-SiX_2-CH_2-SiX_3$, with each X independently being Cl or H, provided at least one terminal X is Cl. Exemplary silicon halides include $Cl_3Si-CH_2-SiCl_2-CH_2-SiCl_3$ or $H_3Si-CH_2-SiH_2-CH_2-SiClH_2$. In yet another alternative, the silicon halide may have the cyclic formula $(-SiX_2-CH_2-)_3$, with each X independently being Cl, Br, or I, such as $(-SiCl_2-CH_2-)_3$. In yet another alternative, the silicon halide may have the cyclic formula $(-SiHX-CH_2-)_3$, with each X independently being Cl, Br, or I, such as $(-SiHCl-CH_2-)_3$. The silicon halide may also be octachlorotrisilane (OCTS or $Si_3Cl_8$), decachlorotetrasilane ($Si_4Cl_{10}$) or dodecachloropentasilane (DCPS or $Si_5Cl_{12}$). These silicon halides are either commercially available or may be synthesized by methods known in the art.

The vapor deposition conditions within the chamber allow the disclosed precursor and the reactant to react and form a silicon-containing film on the substrate. In some embodiments, Applicants believe that plasma-treating the reactant may provide the reactant with the energy needed to react with the disclosed precursor.

Depending on what type of film is desired to be deposited, an additional precursor compound may be introduced into the reactor. The precursor may be used to provide additional elements to the silicon-containing film. The additional elements may include lanthanides (Ytterbium, Erbium, Dysprosium, Gadolinium, Praseodymium, Cerium, Lanthanum, Yttrium), germanium, silicon, titanium, manganese, ruthenium, bismuth, lead, magnesium, aluminum, or mixtures of these. When an additional precursor compound is utilized, the resultant film deposited on the substrate contains silicon in combination with at least one additional element.

The Si-containing film forming compositions and reactants may be introduced into the reactor either simultaneously (chemical vapor deposition), sequentially (atomic layer deposition) or different combinations thereof. The reactor may be purged with an inert gas between the introduction of the composition and the introduction of the reactant. Alternatively, the reactant and the composition may be mixed together to form a reactant/composition mixture, and then introduced to the reactor in mixture form. Another example is to introduce the reactant continuously and to introduce the Si-containing film forming composition by pulse (pulsed chemical vapor deposition).

The vaporized Si-containing film forming composition and the reactant may be pulsed sequentially or simultaneously (e.g. pulsed CVD) into the reactor. Each pulse of the composition may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds. In another alternative, the vaporized composition and one or more reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Si-containing film forming composition and a reactant are simultaneously introduced into the reactor. The two react to form the resulting silicon-containing film. When the reactant in this exemplary CVD process is treated with a plasma, the exemplary CVD process becomes an exemplary PECVD process. The reactant may be treated with plasma prior or subsequent to introduction into the chamber.

In one non-limiting exemplary ALD type process, the vapor phase of the disclosed Si-containing film forming composition is introduced into the reactor, where it is contacted with a suitable substrate. Excess composition may then be removed from the reactor by purging and/or evacuating the reactor. A desired gas (for example, $H_2$) is introduced into the reactor where it reacts with the chemi- or physi-sorbed precursor in a self-limiting manner. Any excess reducing gas is removed from the reactor by purging and/or evacuating the reactor. If the desired film is a Si film, this two-step process may provide the desired film thickness or may be repeated until a film having the necessary thickness has been obtained.

Alternatively, if the desired film contains silicon and a second element, the two-step process above may be followed by introduction of the vapor of an additional precursor compound into the reactor. The additional precursor compound will be selected based on the nature of the silicon-containing film being deposited. After introduction into the reactor, the additional precursor compound is contacted with the substrate. Any excess precursor compound is removed from the reactor by purging and/or evacuating the reactor. Once again, a desired gas may be introduced into the reactor to react with the physi- or chemi-sorbed precursor compound. Excess gas is removed from the reactor by purging and/or evacuating the reactor. If a desired film thickness has been achieved, the process may be terminated. However, if a thicker film is desired, the entire four-step process may be repeated. By alternating the provision of the Si-containing film forming composition, additional precursor compound, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

The silicon-containing films resulting from the processes discussed above may include silicon oxide, silicon nitride, silicon carbide, and carbon doped silicon nitride films. One of ordinary skill in the art will recognize that by judicial selection of the appropriate Si-containing film forming composition, optional precursor compounds, and reactant species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 400° C. for 3600 seconds under a H-containing atmosphere or an O-containing atmosphere. Alternatively, annealing may be performed under a Si-containing atmosphere, provided the process is performed at a temperature below the decomposition temperature of the silicon-containing compound. Exemplary silicon-containing molecules that may be used to form the silicon-containing atmosphere include $SiH_4$, $Si_2H_6$, $MeSiH_3$, $Me_2SiH_2$, aminosilanes, isocyanato silanes (R—Si—NCO), such as Tetra(isocyanato)silane (TICS). The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to densify the films and reduce wet etch rates. This in turn tends to improve the resistivity of the film.

EXAMPLES

The following examples illustrate experiments performed in conjunction with the disclosure herein. The examples are not intended to be all inclusive and are not intended to limit the scope of disclosure described herein.

Example 1

Pyrolysis Test of Pentachlorodisilane [PCDS or $Si_2HCl_5$]

Figure 3:
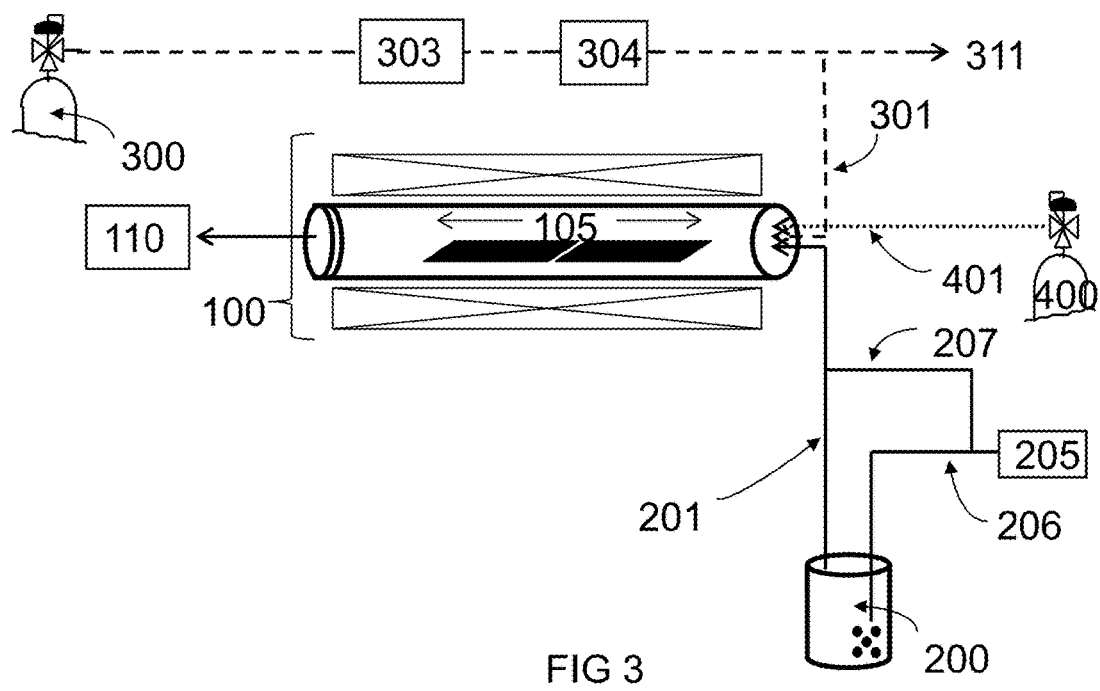
FIG. 3 is a schematic diagram of the vapor deposition apparatus used for the testing in all of the Examples except Example 10.

FIG. 3 is a schematic diagram of deposition apparatus used for the following testing. The apparatus includes a hotwall tube reactor 100 containing substrate coupons 105. A pump 110 removes the contents from the hotwall tube reactor 100.

The vapor of the disclosed Si-containing film forming composition is introduced to the hotwall tube reactor 100 from delivery device 200 via line 201. An inert gas 205, such as $N_2$, is delivered to the delivery device 200 via line 206. The inert gas 205 may also be delivered to the reactor 100 via line 207.

An oxidizing gas may be introduced to the hotwall tube reactor 100 from delivery device 300 via line 301. When the oxidizing gas is ozone, line 301 may include an ozone generator 303 and ozone monitor 304. Oxidizing gas may also be delivered to the exhaust 311.

A nitrogen containing gas may be introduced to the hotwall tube reactor 100 from delivery device 400 via line 401.

One of ordinary skill in the art will recognize that lines 201, 206, 207, 301, and 401 may include numerous pressure gauges, check valves, valves, and pressure regulators and that additional lines for pressure regulation or by-pass flow have not been included in order to simplify the drawing.

To examine the thermal decomposition behavior of PCDS, pyrolysis testing was performed in the deposition apparatus of FIG. 3 at 4 different temperatures (400, 500, 600 and 700° C.) for 30 min on a $SiO_2$ substrate or coupon. The hot wall tube reactor was kept at 1 Torr, with 4 sccm of a continuous flow of PCDS into the reaction chamber using 50 sccm of $N_2$ as a carrier gas. Pyrolysis mimics chemical vapor deposition without a reactant and illustrates the temperature at which the precursor self decomposes.

FIGS. 4 (a), (b), (c), and (d) are X-ray Photoelectron Spectroscopy (XPS) depth profiles of the resulting Si films. As can be seen in FIGS. 4(a) and (b), no thermal decomposition of PCDS occurred because no silicon layers were formed, with the testing revealing the original $SiO_2$ substrate. FIG. 4(c) reveals partial decomposition of the PCDS resulting in a Si-rich $SiO_2$ layer at 600° C. As can be seen in FIG. 4(d), an almost 100% Si layer having little to no O, Cl or C inclusion was formed on the $SiO_2$ substrate from decomposition of PCDS alone at 600-700° C.

Comparative Example 1

Pyrolysis Test of Hexachlorodisilane [HCDS or $Si_2Cl_6$]

Comparative pyrolysis testing of hexachlorodisilane (HCDS or $Si_2Cl_6$) was performed at 4 different temperatures (400, 500, 600 and 700° C.) for 30 min on a $SiO_2$ substrate in the deposition apparatus of FIG. 3. The hot wall tube reactor was kept at 1 Torr, with 4 sccm of a continuous flow of HCDS into the reaction chamber using 50 sccm of $N_2$ as a carrier gas.

FIGS. 5 (a), (b), (c), and (d) show X-ray Photoelectron Spectroscopy (XPS) depth profiles of the resulting Si-containing films. As can be seen, no pure Si layers were formed by HCDS decomposition at any temperature.

Example 2

SiO$_2$ ALD Using PCDS or HCDS and O$_3$/O$_2$

Figure 6:
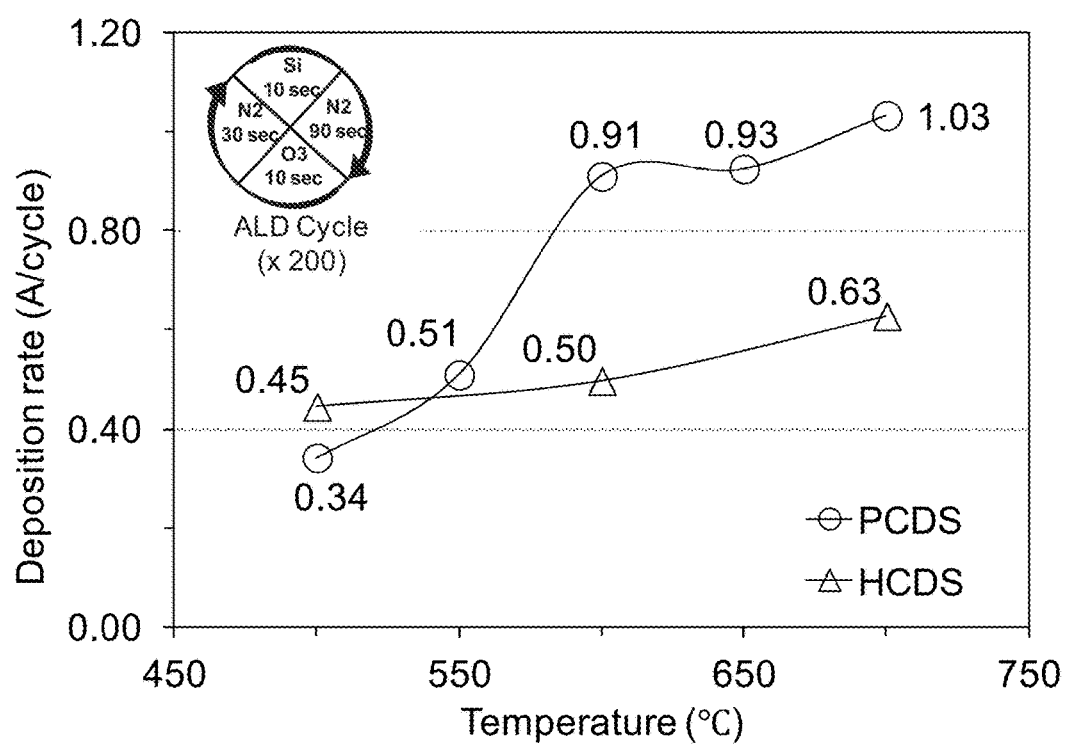
FIG. 6 is a graph of the average ALD deposition rate in Angstroms/cycle of $SiO_2$ films deposited using PCDS (circles) or HCDS (triangles) and ozone versus temperatures ranging from approximately 500° C. to approximately 700° C.

SiO$_2$ ALD was performed using PCDS with O$_3$ as an oxidizing agent at the temperature range of 500~700° C. on Si substrates. The reaction furnace of FIG. 3 was controlled at 1 Torr and 50 sccm of N$_2$ was continuously flowed. The ALD process included the following steps: 1) supply a pulse of 4 sccm of PCDS to the reaction chamber for 10 seconds, 2) purge the excess precursors by 50 sccm of N$_2$ for 90 seconds, 3) supply ~7.2% of O$_3$/O$_2$ (O$_2$: 100 sccm) to the chamber for 10 seconds, 4) purge excess O$_3$/O$_2$ by 50 sccm of N$_2$ for 30 seconds. The sequence from 1) to 4) was repeated for 200 cycles, until the deposited layer achieved suitable thickness for film characterization (i.e., over 100 Å). The method was repeated with HCDS replacing PCDS with the same ALD process conditions as PCDS. The average deposition rates from 4 separate coupon substrate locations using PCDS (circle) and 4 separate coupon locations using HCDS (triangle) are shown in FIG. 6.

The deposition rate of PCDS increased from 500° C. to 600° C., and exhibited a plateau between 600° C. and 650° C., then increased again up to 700° C. From this temperature dependency of deposition rate of PCDS in ALD process, an ALD window may be observed between 600° C. and 650° C. However in the same Figure, the deposition rate of HCDS continuously increased in the temperature range of 500° C. to 700° C. As a result, no considerable ALD window was observed for HCDS. Applicants believe that the SiO$_2$ ALD window (i.e., 600-650° C.) obtained from PCDS provides the highest temperature ALD window using a chlorosilane based Si precursors, like monochlorosilane or hexachlorodisilane. One of ordinary skill in the art will recognize that temperature and pressure may be manipulated to change this ALD deposition window.

Example 3

SiO$_2$ ALD Saturation Behavior of PCDS and O$_3$

Figure 7:
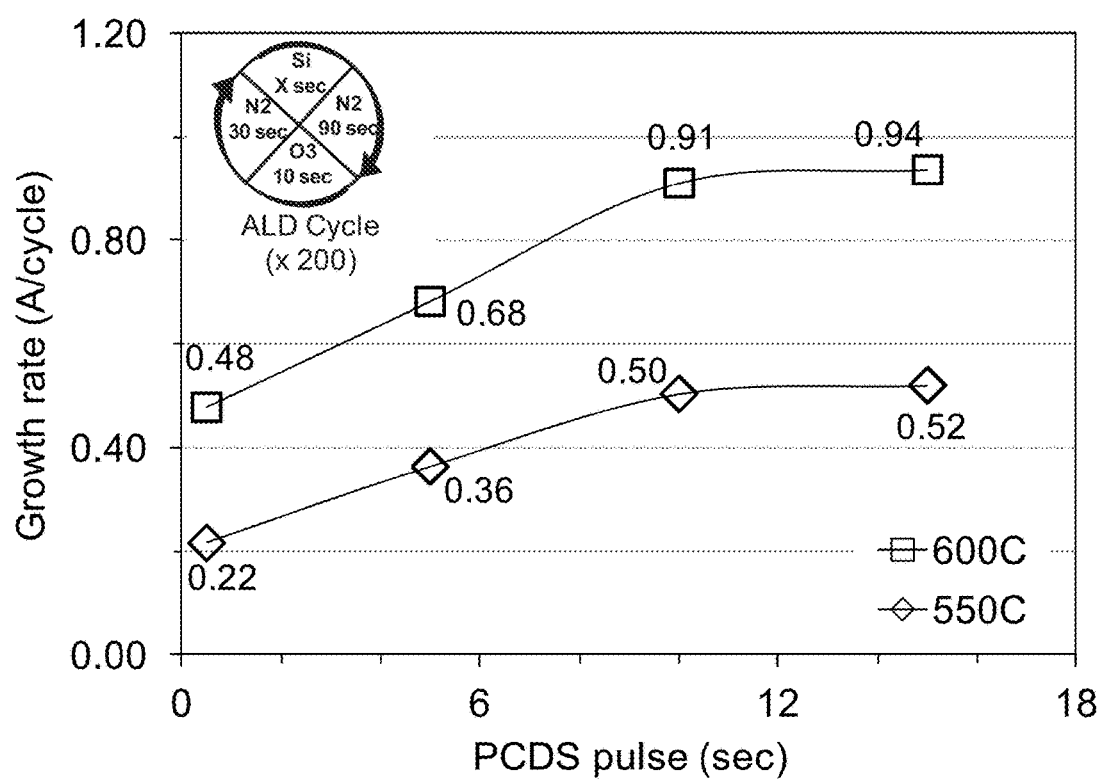
FIG. 7 is a graph of the average ALD growth rate in Angstroms/cycle of $SiO_2$ films using PCDS and ozone at approximately 600° C. (squares) or approximately 550° C. (diamonds) versus PCDS pulse duration in seconds.

Based on the results from Example 2, the PCDS pulse time dependency of SiO$_2$ ALD growth behaviour is examined at two temperatures, 550° C. and 600° C., and the result is provided in FIG. 7. The same process conditions used for the temperature dependency test in Example 2 were applied to this evaluation, except the pulse time of PODS was varied at both 550° C. (diamond) and 600° C. (square). At both temperatures, stable average deposition rates are observed with pulse times of PODS between 10~15 seconds from 3-5 locations on the coupon: 0.91~0.94 Å/cycle at 600° C. and 0.50~0.52 Å/cycle at 550° C. The consistent deposition rates are considered a characteristic of ALD saturation.

Example 4

SiO$_2$ ALD Film Composition by XPS

XPS analysis was performed for SiO$_2$ ALD films deposited in Example 2 from PODS on Si substrates at 550, 600, 650, and 700° C. to examine the film composition. FIGS. 8 a-d shows the result of XPS depth profile of 5-elements, Si, Cl, C, N and O. No Cl, C and N was detected in the films. The XPS sputter energy was set higher for the films deposited at 650° and 700° C. than for those deposited at 550° C. and 600° C. As a result, the analysis results for the etch times of the films deposited at 650° and 700° C. penetrates deeper into the films than equivalent etch times of the films deposited at 550° C. and 600° C.

Example 5

Step Coverage of SiO$_2$ ALD Film Using PODS

Step coverage of SiO$_2$ films deposited by ALD was examined on pattern wafers with holes having an aspect ratio (AR)=40 with a 8 micrometer depth at 600° C. The reaction furnace of FIG. 3 was controlled at 1 Torr and 50 sccm of N$_2$ was continuously flowed. The ALD process included the following steps: 1) supply a pulse of 4 sccm of PCDS to the reaction chamber for 10 seconds, 2) purge the excess precursors by 50 sccm of N2 for 90 seconds, 3) supply ~7.2% of O$_3$/O$_2$ (O2: 100 sccm) to the chamber for 10 seconds, 4) purge excess O$_3$/O$_2$ by 50 sccm of N$_2$ for 10 seconds. The sequence from 1) to 4) was repeated for 350 cycles. FIGS. 9 and 9(a)-(c) are scanning electron microscope pictures showing the resulting step coverage in the entire hole (FIG. 9) and three different positions within FIG. 9: (FIG. 9(a)) top step coverage=93%, (FIG. 9(b)) middle (around 2 micrometer depth from top) step coverage=77% and (FIG. 9(c)) bottom step coverage=73%.

Example 6

Catalytic Low Temperature SiO$_2$ ALD

SiO$_2$ films were deposited using ALD with PCDS, H$_2$O as an oxidizing agent, and triethylamine (TEA) as a catalyst. The reaction furnace of FIG. 3 was controlled at 5 Torr, at the temperature range of 50~100° C., and 200 sccm of Ar was continuously flowed. The deposition process included the following steps: 1) introducing a pulse of 1 sccm of PCDS and 50 sccm of TEA to the reaction furnace for 10 seconds, 2) purging excess PCDS and TEA from the reaction furnace by 1 slm of Ar for 10 seconds, 3) introducing 15 sccm of H$_2$O and 50 sccm of TEA and 1 slm of Ar to the furnace for 20 seconds, 4) purging excess H$_2$O and TEA by 1 slm of Ar for 20 seconds. The sequence from 1) to 4) was repeated for 300 cycles.

Figure 10:
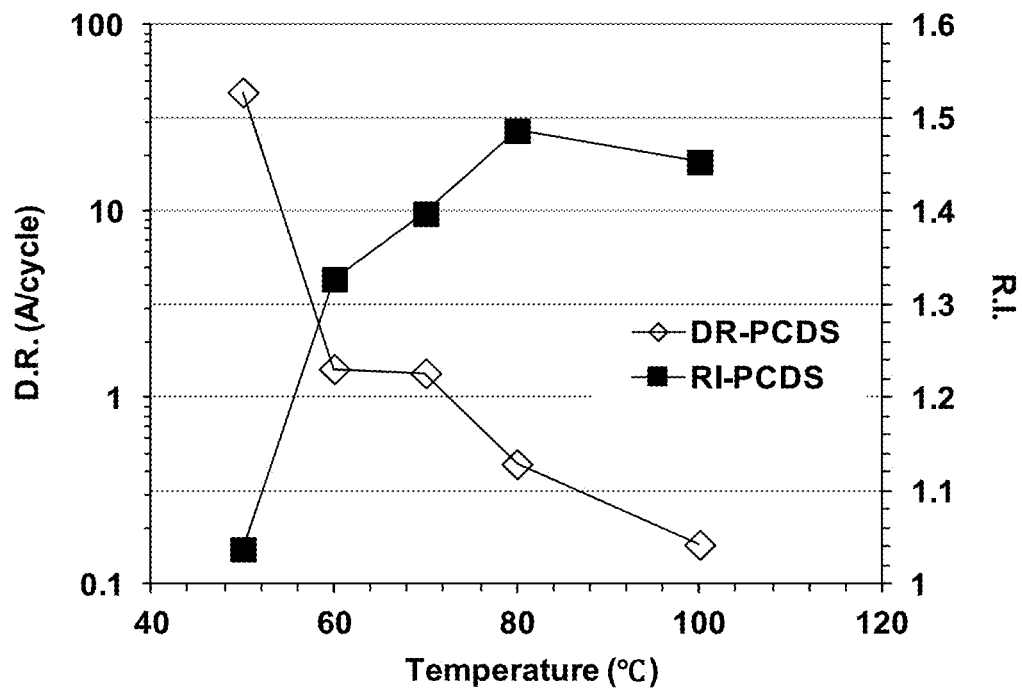
FIG. 10 is a graph of the average ALD deposition rate in Angstroms/cycle (diamond) and refractive index (square) of $SiO_2$ films deposited using PCDS (circles) or HCDS (triangles), water, and triethylamine versus temperatures ranging from approximately 50° C. to approximately 100° C.
Figure 11:
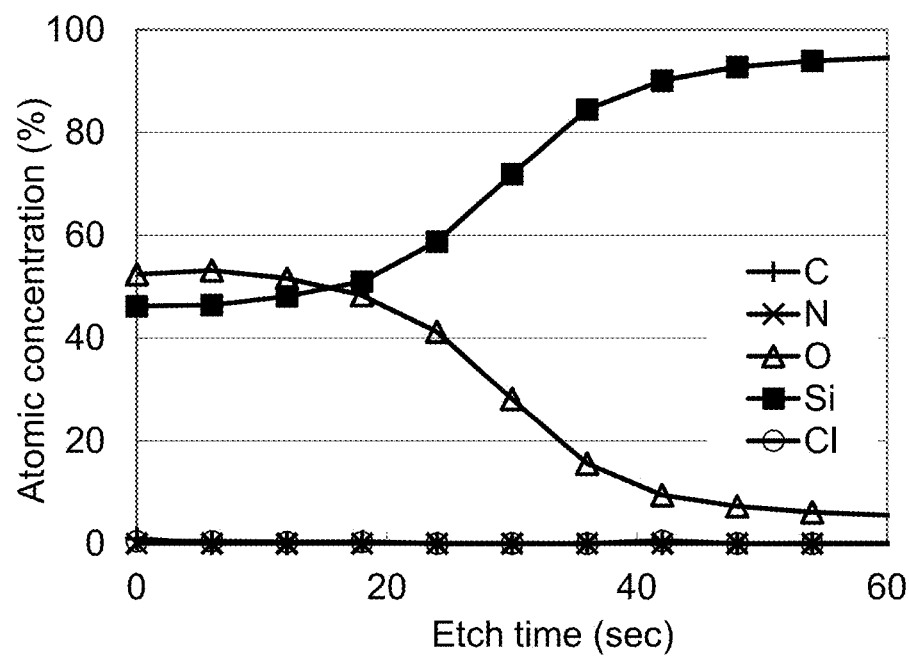
FIG. 11 is a XPS depth profile of the silicon oxide film resulting from ALD deposition using PCDS, water, and TEA.

FIG. 10 is a graph demonstrating the process temperature dependence of deposition rate (hollow diamond) and refractive index (solid square). Deposition rates of ~1.4 Å/cycle and refractive index of ~1.39 was obtained at 70° C., indicating a low density film that may be suitable for sacrificial use. FIG. 11 is a graph demonstrating the XPS depth profile of the deposited SiO$_2$ film at 70° C., which demonstrates that the resulting film contains no impurities.

Example 7

Low Temperature CVD of SiN

Figure 12:
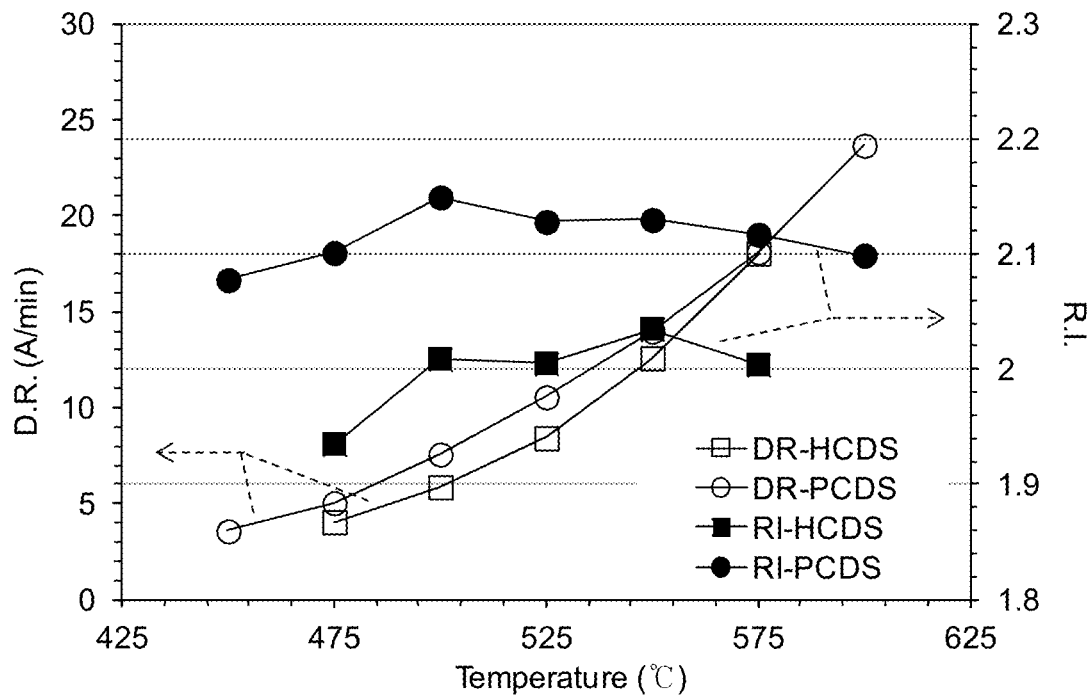
FIG. 12 is a graph of the average CVD deposition rate in Angstroms/minute (hollow) and refractive index (filled) of SiN films deposited using PCDS (circle) and HCDS (square) and $NH_3$ versus temperatures ranging from approximately 450° C. to approximately 600° C.

SiN films were deposited via CVD using PCDS (circle) or HCDS (square) as a Si source and ammonia (NH$_3$) as a nitridation source. The reaction furnace of FIG. 3 was controlled at 1 Torr, temperature varied from 450° C. to 600° C., and 100 sccm of Ar was continuously flowed. A mixed gas flow of 1 sccm of Si source and 25 sccm of NH$_3$ was supplied to the reaction furnace for 60~120 minutes, until the deposited layer achieved suitable thickness. FIG. 12 is a graph illustrating the deposition rate (hollow) and refractive index (solid) obtained with PCDS+NH$_3$ than that with HCDS+NH$_3$.

Example 8

Medium Temperature ALD of SiN

SiN films were deposited via ALD using PCDS (circle), HCDS (square), or OCTS (octachlorotrisilane)(triangle) as a Si source and ammonia (NH$_3$) as a nitridation source. The pressure in the reaction furnace of FIG. 3 is controlled at 5 Torr, the temperature varied from 350° C. to 600° C., and 100 sccm of Ar was continuously flowing. The deposition process includes the following steps: 1) introducing a pulse of 1 sccm of Si source to the reaction furnace for 10 seconds, 2) purging excess Si source from the reaction furnace by 1 slm of Ar for 10 seconds, 3) introducing 50 sccm of NH$_3$ to the reaction furnace, and 4) purging excess NH$_3$ from the reaction furnace by 1 slm of Ar for 20 seconds. The sequence from 1) to 4) were repeated for 200~400 cycles, until the deposited layer achieved suitable thickness of over 100 Å.

Figure 13:
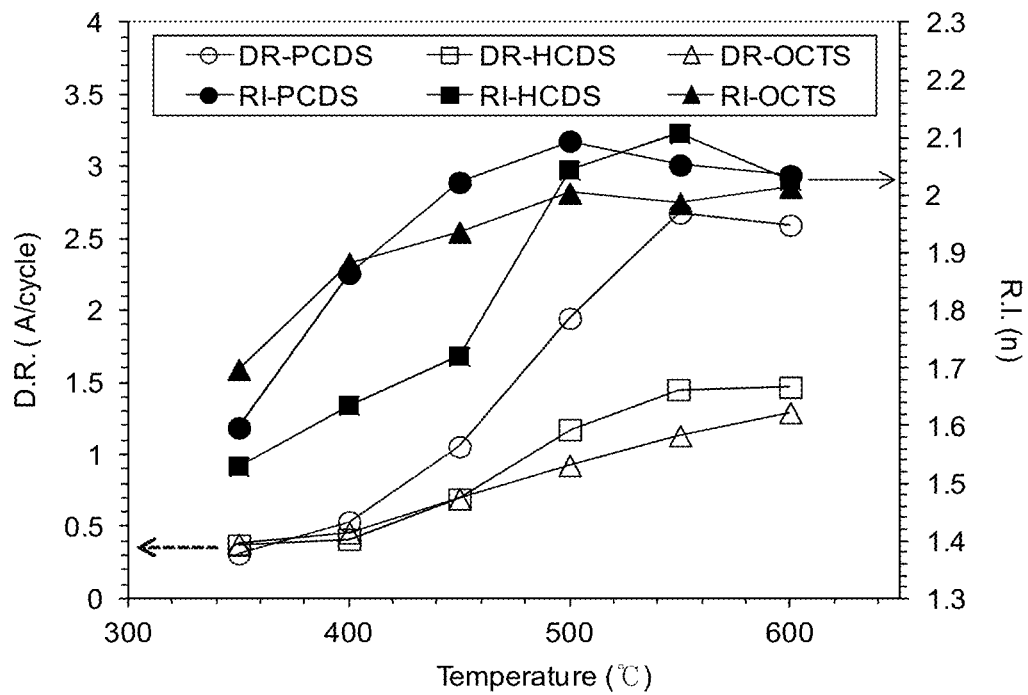
FIG. 13 is a graph of the average ALD deposition rate in Angstroms/cycle (hollow) and refractive index (filled) of SiN films deposited using PCDS (circle), HCDS (square), and octachlorotrisilane (triangle) and $NH_3$ versus temperature ranging from approximately 350° C. to approximately 600° C.

FIG. 13 is a graph demonstrating the temperature dependence of the PCDS (circle), HCDS (square), and OCTS (triangle) deposition rates (hollow) and refractive indices (solid) from the process.

PCDS exhibited higher deposition rates and refractive indices as compared to HCDS or OCTS, except the refractive index value of HCDS is higher at 400° C. and 550° C. The deposition rate of PCDS and HCDS exhibit a plateau between 550° C. and 600° C., indicating self-limiting ALD behavior, but no plateau was observed from OCTS.

Figure 14:
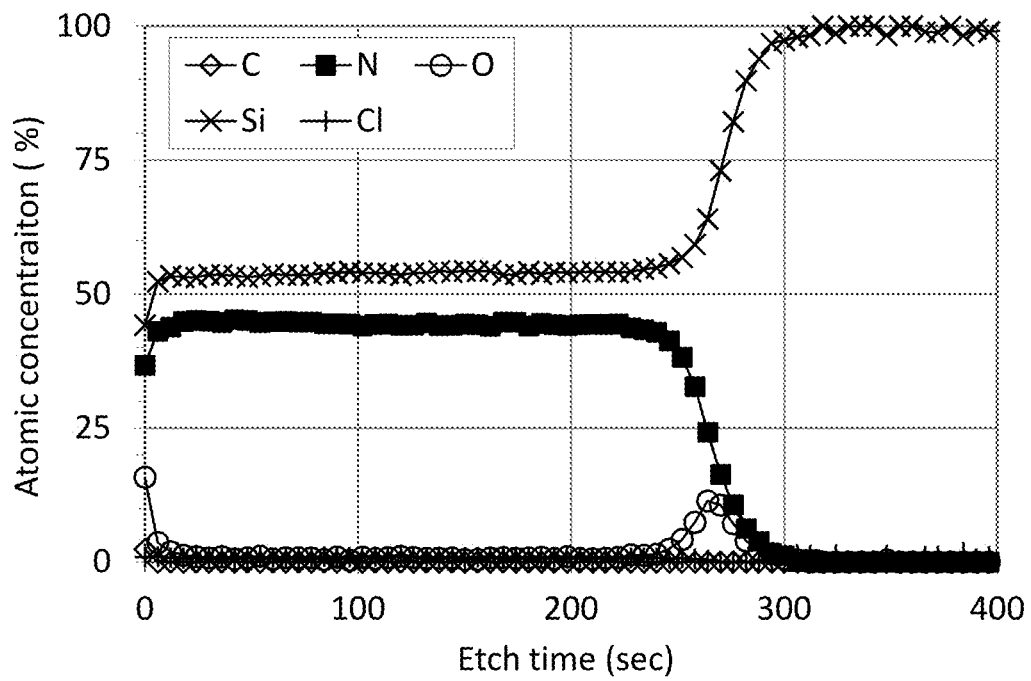
FIG. 14 is a XPS depth profile for the SiN film deposited at 600° C. with PCDS and $NH_3$.

FIG. 14 is a graph demonstrating the XPS depth profile of the SiN film deposited at 600° C. with PCDS and NH$_3$, including the 54% of Si, 45% of N, and trace amount of O, C, and Cl impurities.

As shown in FIG. 13, silicon nitride films with refractive indices that may be acceptable for use in the fabrication of semiconductor devices are deposited at substrate temperatures ranging from 450° C. to 600° C. using PCDS and ranging from 500° C. to 600° C. using HCDS. The refractive index of silicon nitride films deposited from OCTS only become commercially viable at 600° C. Furthermore, the deposition rate of silicon nitride films from PCDS is substantially higher than from HCDS within this temperature range (i.e., 40%-100% higher). Using PCDS therefore allows formation of a high quality silicon nitride film at a lower temperature and with a surprisingly high deposition rate. The temperature range extension producing refractive indices near that of pure silicon nitride for PCDS as compared to HCDS is also surprising and beneficial for producing semiconductor devices. A desired silicon nitride film may be obtained at substrate temperatures 50° C. lower than was possible using the industry standard material HCDS. The lower temperature permits a lower thermal budget in processing which allows for more flexibility and options for subsequent processing steps.

Example 9

Low Temperature ALD of SiC

Figure 15:
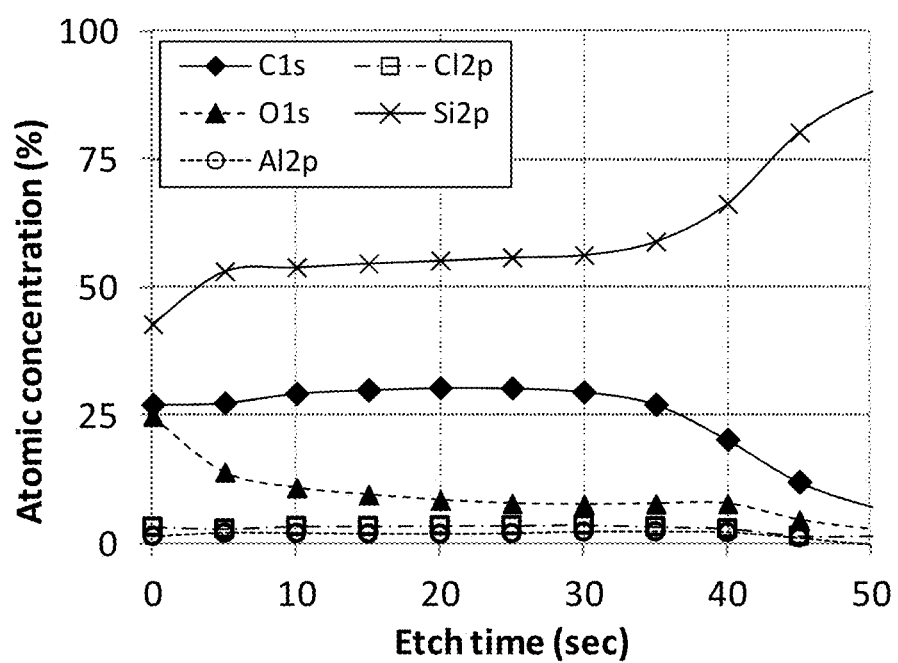
FIG. 15 is a XPS depth profile of the SiC film resulting from ALD deposition using PCDS or HCDS and trimethylaluminum at 400° C.
Figure 16:
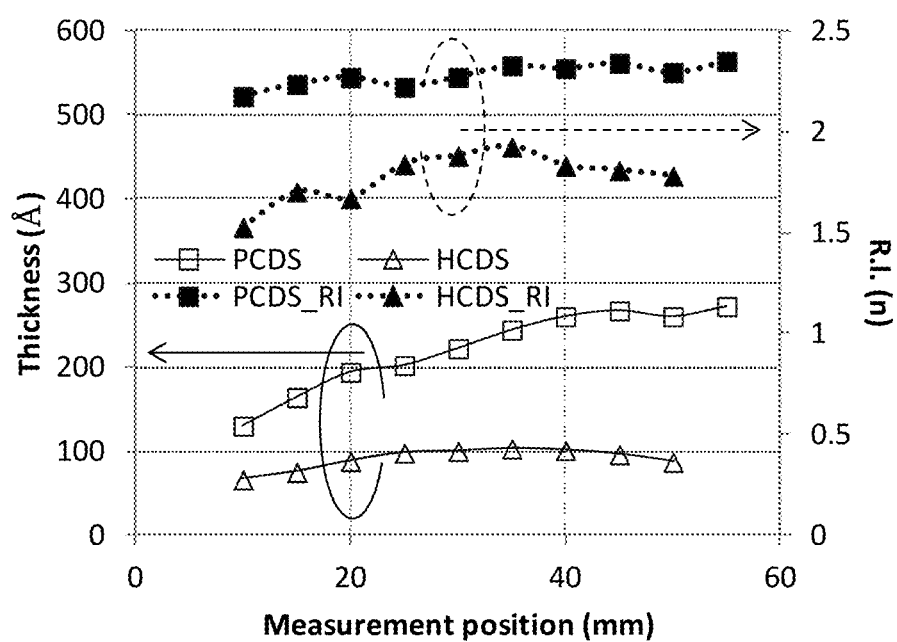
FIG. 16 is a graph demonstrating the film thickness and refractive index versus measurement position.

SiC films were deposited via ALD using PCDS (square) or HCDS (triangle) as a Si source and trimethylalumimum (TMA) as a carbon source. The pressure in the reaction furnace of FIG. 3 was controlled at 8 Torr, the temperature varied from 350° C. to 400° C., and 10 sccm of N$_2$ was continuously flowing. The deposition process includes the following steps: 1) introducing a pulse of 0.8 sccm of Si source to the reaction furnace for 15 seconds, 2) purging excess Si source from the reaction furnace by 25 sccm of N$_2$ for 30 seconds, 3) introducing 1.8 sccm of TMA to the reaction furnace, and 4) purging excess TMA from the reaction furnace by 25 sccm of N$_2$ for 60 seconds. The sequence from 1) to 4) was repeated 290 cycles, until the deposited layer achieved suitable layer thickness of over 100 Å. FIG. 15 shows the XPS depth profile of the SiC films deposited at 400° C., including the O, Al, Cl impurities. FIG. 16 shows the film thickness (hollow) and refractive indices (solid) based on the measurement position. The graph illustrates the higher refractive index obtained with PCDS+TMA than that with HCDS+TMA. The films having the higher refractive index (i.e., from PCDS+TMA) may be more dense than those with the lower refractive index (i.e., from HCDS+TMA), which may enhance wet etching resistivity.

Example 10

Low-T PEALD of Si(C)N

Figure 17:
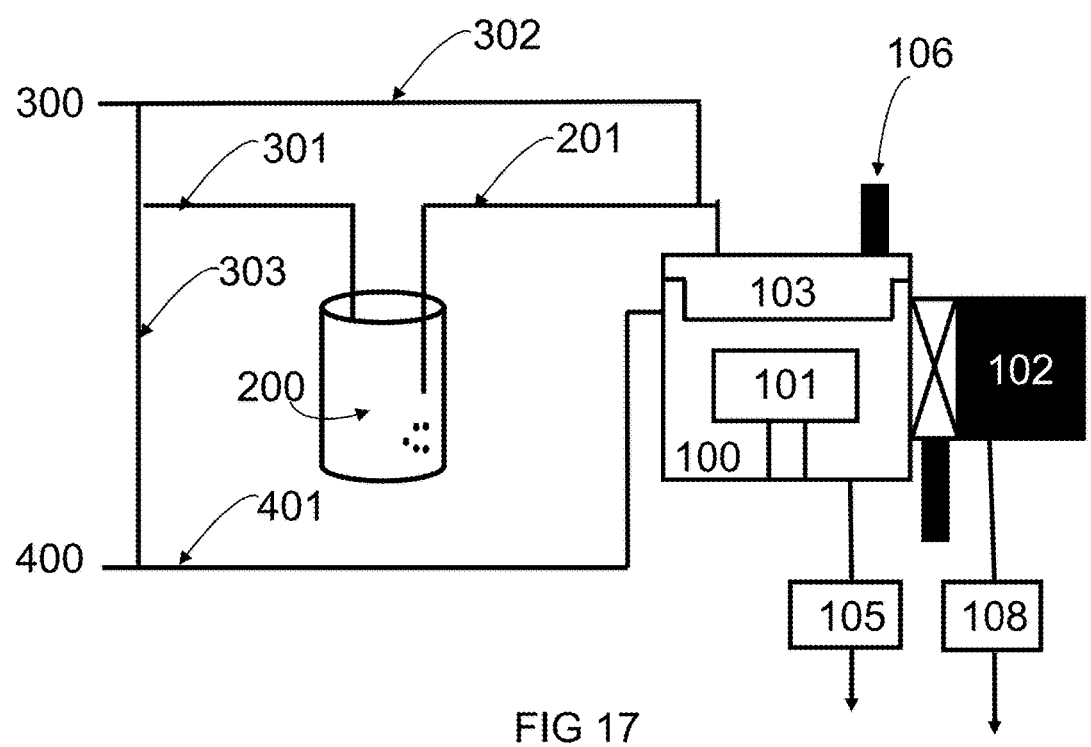
FIG. 17 is a schematic diagram of a plasma vapor deposition apparatus used in Example 10.

FIG. 17 is a schematic diagram of deposition apparatus used for the testing of Example 10. The apparatus includes a reactor 100 containing a wafer stage 101. The wafer is transferred to the wafer stage 101 by load lock chamber 102, which is connected to pump 108. A showerhead 103 is located in the top of the reactor 100, and plasma may be generated by the RF generator 106. A dry pump 105 removes the contents of the reactor 100.

The disclosed Si-containing precursor is introduced to the reactor 100 from delivery device 200 via line 201. An inert gas 300, such as Ar, is delivered to the delivery device 200 via line 301. The inert gas 300 may also be delivered to the reactor 100 via line 302.

A nitridation gas 400, such as N$_2$, is introduced to the reactor 100 via line 401. The inert gas 300 may also be delivered to the nitridition gas 400 via line 303.

One of ordinary skill in the art will recognize that lines 201, 301, 302, 303, and 401 may include numerous pressure gauges, check valves, valves, and pressure regulators and that additional lines for pressure regulation or by-pass flow have not been included in order to simplify the drawing.

Si(C)N films were deposited at low temperature using pentakis (dimethylamino)disilane (Si$_2$H(NMe$_2$)$_5$) as a Si source and a nitrogen containing reactant via a plasma enhance ALD process using the deposition apparatus of FIG. 17. The process was done on 6" Si wafer, under direct plasma mode. The pressure in the reaction furnace of FIG. 17 is controlled at 1 Torr, the temperature varied from 200° C. to 400° C., and 500 sccm of Ar was continuously flowing. The deposition process includes the following steps: 1) introducing a N$_2$ plasma pulse (100 W) of 100 sccm of N$_2$ to the reaction furnace for 7 seconds, 2) purging the reaction furnace by 500 sccm of N$_2$ for 3 seconds, 3) introducing 1 sccm of Pentakis(dimethylamino)disilane to the reaction furnace for 5 seconds, and 4) purging excess Si precursor from the reaction furnace by 500 sccm of N$_2$ for 5 seconds. The sequence from 1) to 4) was repeated 500 cycles until the deposited layer achieved suitable layer thickness of over 100 Å.

Figure 18:
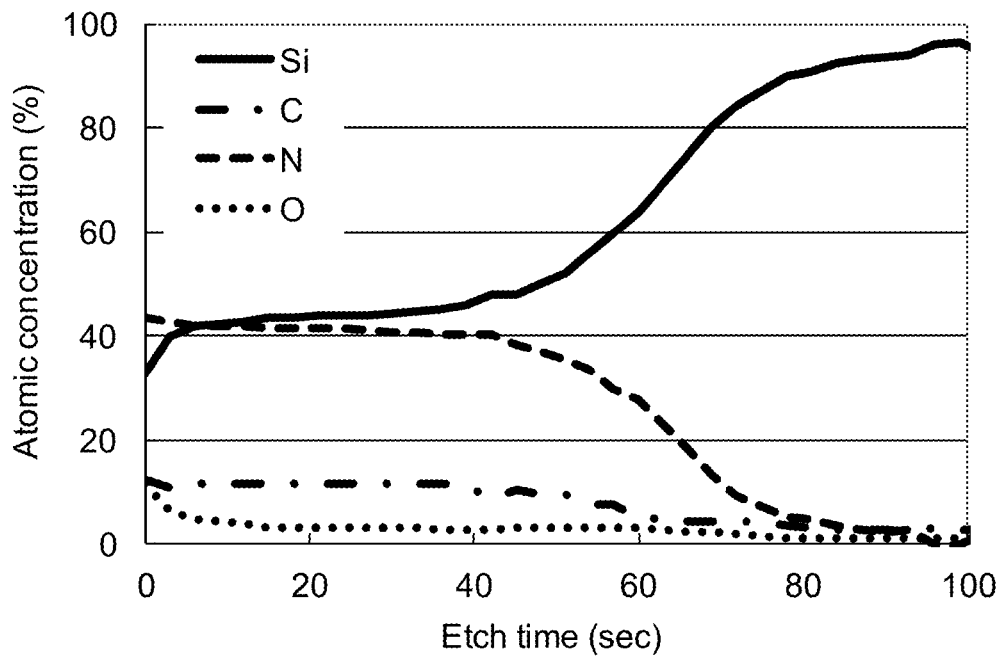
FIG. 18 is a XPS depth profile of the Si(C)N film resulting from ALD deposition using pentakis(dimethylamino)disilane and $N_2$ plasma at 275° C.
Figure 19:
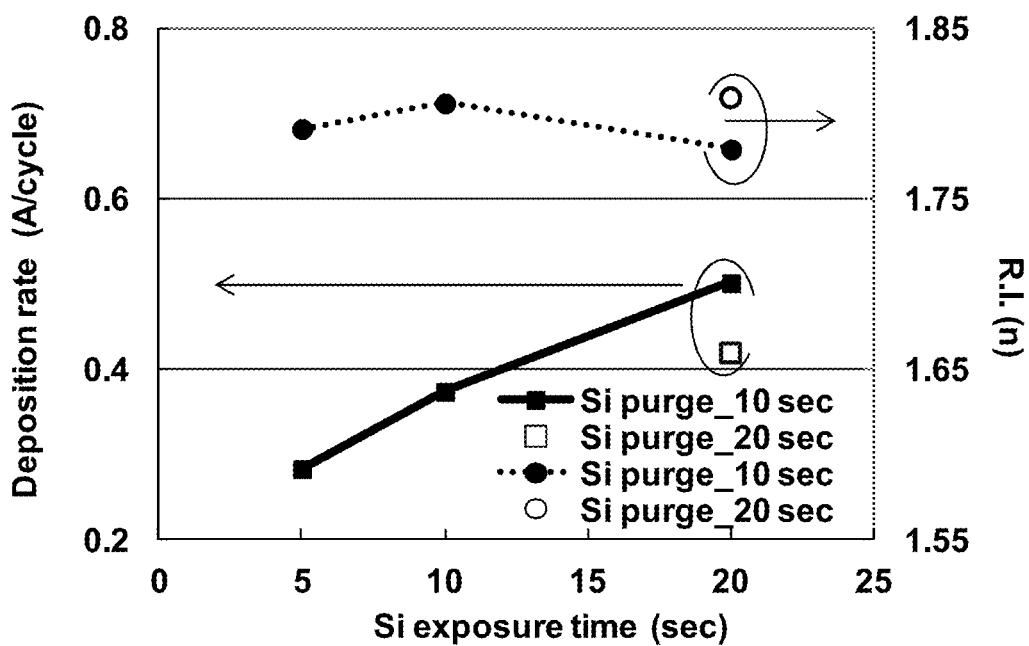
FIG. 19 is a graph of the average ALD deposition rate in Angstroms/cycle (square) and refractive index (circle) of the Si(C)N films deposited using pentakis(dimethylamino) disilane and $N_2$ plasma versus purge time in seconds.

FIG. 18 shows the XPS depth profile of the Si(C)N film deposited at 275° C., which exhibited a formation of SiN, with ~11% C and ~2% O in the film. FIG. 19 shows the Si exposure time of deposition rate (square) and refractive index (circle) at a 10 second (solid) and 20 second (hollow)

purge time. The graph, in case of 10 sec purge time, illustrates that the deposition rate increased corresponding to Si exposure time, but the refractive index remained stable at ~1.8 to Si exposure time. However when the Si purge time increased from 10 sec to 20 sec, for the case of 20 sec Si exposure time, the deposition rate decreased from 0.5 Å/cycle to 0.42 Å/cycle, and the RI increased from 1.78 to 1.81, which may demonstrate an inefficient purge time for the longer pulse process.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A thermal ALD method of depositing a silicon nitride film on a substrate, the method comprising:
   a) Setting a reactor containing the substrate to a temperature ranging from approximately 450° C. to approximately 650° C. and a pressure ranging from approximately 0.1 to approximately 100 Torr (13 Pa to 1,333 Pa);
   b) Introducing a vapor of pentachlorodisilane into the reaction chamber to form a silicon-containing layer on the substrate;
   c) Reacting an nitrogen containing reactant with the silicon-containing layer to form a layer of the silicon nitride film having a thickness ranging from approximately 0.3 Å (0.03 nm) to approximately 2 Å (0.2 nm) and a refractive index ranging from approximately 1.8 to 2.1; and
   d) Repeating steps b) and c).

2. The method of claim 1, wherein the nitrogen containing reactant is $NH_3$.

3. The method of claim 1, wherein the silicon nitride film is deposited without using plasma.

4. The method of claim 1, wherein the pressure ranging from approximately 4.75 to approximately 5.25 Torr (633 Pa to 700 Pa).

5. The method of claim 1, wherein the thickness ranges from approximately 1 Å (0.1 nm) to approximately 2 Å (0.2 nm) and the refractive index ranges from approximately 2.0 to 2.1.

* * * * *